US012783072B2

(12) United States Patent
Kim et al.

(10) Patent No.: US 12,783,072 B2
(45) Date of Patent: Nov. 3, 2026

(54) DISPLAY DEVICE

(71) Applicant: Samsung Display Co., LTD., Yongin-si (KR)

(72) Inventors: Hyeong Jun Kim, Yongin-si (KR); Jun Ho Kwack, Yongin-si (KR); Ki Sik Ban, Yongin-si (KR); Suk Ho Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 18/815,455

(22) Filed: Aug. 26, 2024

(65) Prior Publication Data

US 2025/0238094 A1 Jul. 24, 2025

(30) Foreign Application Priority Data

Jan. 19, 2024 (KR) ........................ 10-2024-0008587

(51) Int. Cl.
*G06F 3/041* (2006.01)
*H10K 59/131* (2023.01)
*H10K 59/40* (2023.01)

(52) U.S. Cl.
CPC ........ *G06F 3/0412* (2013.01); *G06F 3/04164* (2019.05); *H10K 59/131* (2023.02); *H10K 59/40* (2023.02)

(58) Field of Classification Search
None
See application file for complete search history.

(56) References Cited

U.S. PATENT DOCUMENTS 10,649,267 B2 5/2020 Tuan et al.
11,537,226 B2 12/2022 Lee et al.
2020/0371549 A1 * 11/2020 Park ....................... H10K 59/65
2021/0005696 A1 1/2021 Bang et al.

FOREIGN PATENT DOCUMENTS

KR 10-2018-0073352 A 7/2018
KR 10-2023-0048178 A 4/2023
KR 10-2023-0091845 A 6/2023

* cited by examiner

*Primary Examiner* — Brian M Butcher
(74) *Attorney, Agent, or Firm* — Womble Bond Dickinson (US) LLP

(57) ABSTRACT

A display device includes: a display panel including a display area, and a bending area at one side of the display area; and a panel upper member on the display panel. The display panel further includes: a substrate; a first conductive layer on the substrate in the bending area; and a second conductive layer on the first conductive layer at one side of the bending area. One end of the panel upper member facing toward the bending area is more protruded toward the bending area than one end of the second conductive layer facing toward the bending area.

20 Claims, 16 Drawing Sheets

10: 11, 12, 13
FOL2: FOL2_1, FOL2_2

DISPLAY DEVICE

CROSS-REFERENCE TO RELATED APPLICATION

The present application claims priority to and the benefit of Korean Patent Application No. 10-2024-0008587, filed on Jan. 19, 2024, in the Korean Intellectual Property Office, the entire disclosure of which is incorporated by reference herein.

BACKGROUND

1. Field

Aspects of embodiments of the present disclosure relate to a display device.

2. Description of the Related Art

With the advancement of the information age, demand for a display device for displaying an image has increased with various forms. The display device may be a liquid crystal display device, a field emission display device, or a light emitting display device. The light emitting display device may include an organic light emitting display device that includes an organic light emitting diode element as a light emitting element, or an inorganic light emitting display device that includes an inorganic light emitting diode element as a light emitting element.

The display device includes a display area for displaying an image, and a periphery of the display area, for example, such as a non-display area disposed to surround (e.g., around the periphery of) the display area. A width of the non-display area may be gradually reduced in order to increase the immersion of the display area and the aesthetic sense of the display device.

In order to increase the portability of the display device, and at the same time, provide a wider display screen, a bendable display device in which a display area may be bent, or a foldable display device in which a display area may be folded, has been developed.

The above information disclosed in this Background section is for enhancement of understanding of the background of the present disclosure, and therefore, it may contain information that does not constitute prior art.

SUMMARY

One or more embodiments of the present disclosure may be directed to a display device having a reduced or minimized dead space.

One or more embodiments of the present disclosure may be directed to a display device that minimizes or reduced an inflow of static electricity from the outside.

However, the aspects and features of the present disclosure are not limited to those above, and the above and other aspects and features will be clearly understood by those having ordinary skill in the art from the following description of some embodiments of the present disclosure.

According to one or more embodiments of the present disclosure, a display device includes: a display panel including a display area, and a bending area at one side of the display area; and a panel upper member on the display panel. The display panel further includes: a substrate; a first conductive layer on the substrate in the bending area; and a second conductive layer on the first conductive layer at one side of the bending area. One end of the panel upper member facing toward the bending area is more protruded toward the bending area than one end of the second conductive layer facing toward the bending area.

In an embodiment, an upper surface of the display panel may be an exposed surface in the bending area.

In an embodiment, the display panel may not include a bending passivation layer on the upper surface of the display panel in the bending area.

In an embodiment, a distance in which the one end of the panel upper member protrudes toward the bending area from the one end of the second conductive layer may be 10 μm or more.

In an embodiment, the display panel may further include a light emitting element layer on the substrate; the first conductive layer may be on one surface of the light emitting element layer; and the second conductive layer may be on another surface of the light emitting element layer.

In an embodiment, the display panel may further include: an insulating layer between the first conductive layer and the second conductive layer; and a contact hole penetrating through the insulating layer, and connecting the first conductive layer with the second conductive layer.

In an embodiment, the panel upper member may include any one of a protective member, an optical member, or an adhesive member.

In an embodiment, the panel upper member may include an adhesive layer.

In an embodiment, the panel upper member may cover the display area and the bending area, and an adhesive force of the panel upper member at a portion covering the bending area may be smaller than that of the panel upper member at a portion covering the display area.

In an embodiment, the display device may further include a touch driver located on one end of the display panel. The display panel may further include a first line on the second conductive layer, and a second line on the first conductive layer. The first and second lines may be electrically connected to the touch driver.

In an embodiment, the one end of the panel upper member may be more protruded toward the bending area than one end of the first line.

In an embodiment, a distance in which the one end of the panel upper member protrudes toward the bending area from the one end of the first line may be 10 μm or more.

In an embodiment, the display panel may further include a touch electrode on the second conductive layer; and the touch electrode may be electrically connected to the touch driver through the first line and the second line.

In an embodiment, the first line may be connected to the touch electrode; the second line may be connected to the touch driver; and the first line and the second line may be connected to each other through a contact hole.

In an embodiment, the display device may further include a display driver located on one end of the display panel. The display panel may further include a third line on the first conductive layer; and the third line may be electrically connected to the display driver.

In an embodiment, the display panel may further include: an upper insulating film on the third line; and a protective pattern covering the upper insulating film on the second conductive layer.

In an embodiment, the one end of the panel upper member may be more protruded toward the bending area than one end of the protective pattern.

In an embodiment, a distance in which the one end of the panel upper member protrudes toward the bending area from the one end of the protective pattern may be 10 μm or more.

In an embodiment, the display panel may further include a light emitting element, and a data line configured to provide a data voltage to the light emitting element; and the third line may be connected to the data line.

In an embodiment, the display panel may further include: a folding area that overlaps with the display area; and first and second non-folding areas located at opposite sides of the folding area, respectively.

In an embodiment, a maximum dynamic impact counter angle of the display panel in the bending area may be 3° or more.

According to one or more embodiments of the present disclosure, a display device includes: a display panel including: a first portion including a light emitting element; a second portion at one side of the first portion and bent; and a third portion at one side of the second portion; a panel upper member on the first portion; and a display driver and a touch driver on the third portion. An upper surface of the second portion is an exposed surface, and the display panel further includes: a substrate; a first line on a first conductive layer located on the substrate, and connected to the display driver; and a second line on a second conductive layer located on the first conductive layer, and connected to the touch driver. The second line includes a first sub line on the second conductive layer, and a second sub line on the first conductive layer. The first line and the second sub line are located in the second portion, and the first sub line is located in the first portion or the third portion. One end of the panel upper member facing toward the second portion is more protruded toward the second portion than one end of the first sub line facing toward the second portion.

In an embodiment, a distance in which the one end of the panel upper member protrudes toward the second portion from the one end of the first sub line may be 10 μm or more.

In an embodiment, the display panel may further include: an upper insulating film on the first line; and a protective pattern covering the upper insulating film on the second conductive layer.

In an embodiment, the one end of the panel upper member may be more protruded toward the second portion than one end of the protective pattern.

In an embodiment, a distance in which the one end of the panel upper member protrudes toward the second portion from the one end of the protective pattern may be 10 μm or more.

In an embodiment, the panel upper member may cover the first to third portions.

In an embodiment, the display device may further include a cover tape covering the display driver, and one end of the cover tape may be more protruded toward the second portion than the one end of the first sub line.

In an embodiment, the cover tape may cover the first to third portions.

According to some embodiments of the present disclosure, a display device having a minimized or reduced dead space may be provided.

According to some embodiments of the present disclosure, a display device that may minimize or reduce an inflow of static electricity may be provided.

However, the present disclosure is not limited to the above aspects and features, and additional aspects and features will be set forth, in part, in the detailed description that follows with reference to the drawings, and in part, may be apparent therefrom, or may be learned by practicing one or more of the presented embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
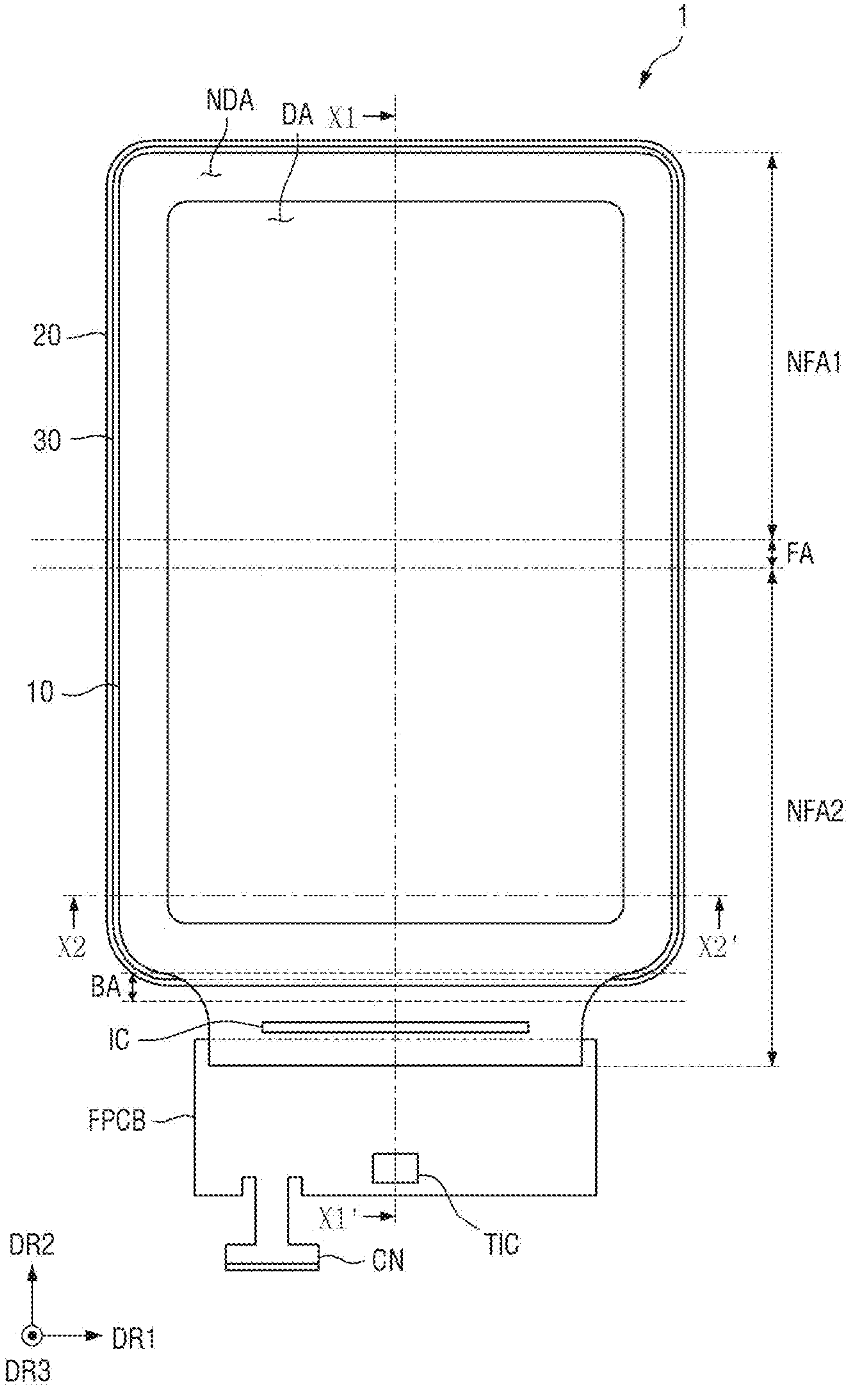
FIG. 1 is a plan view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Further, as would be understood by a person having ordinary skill in the art, in view of the present disclosure in its entirety, each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner, unless otherwise stated or implied.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
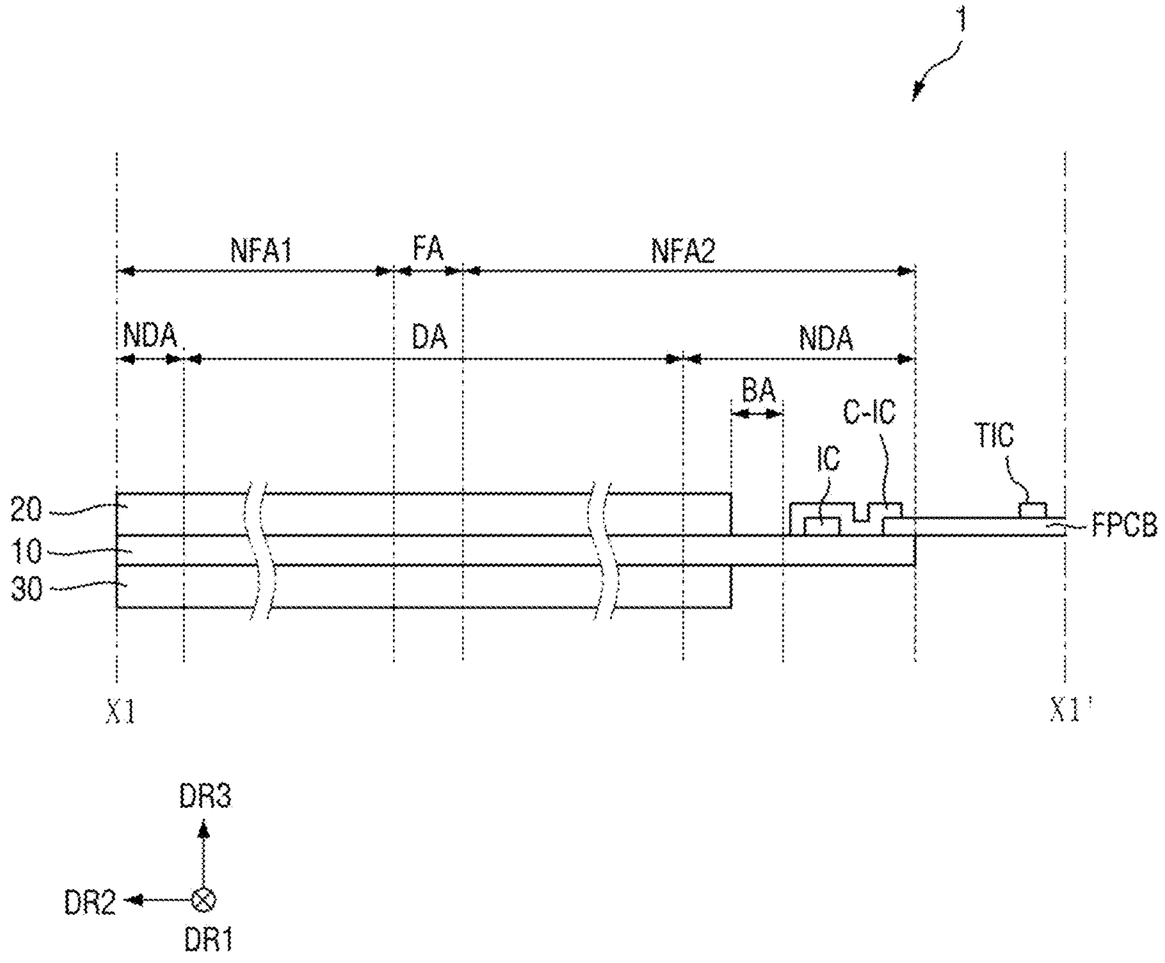
FIG. 2 is a schematic cross-sectional view illustrating a display device taken along the line X1-X1' of FIG. 1.
Figure 3:
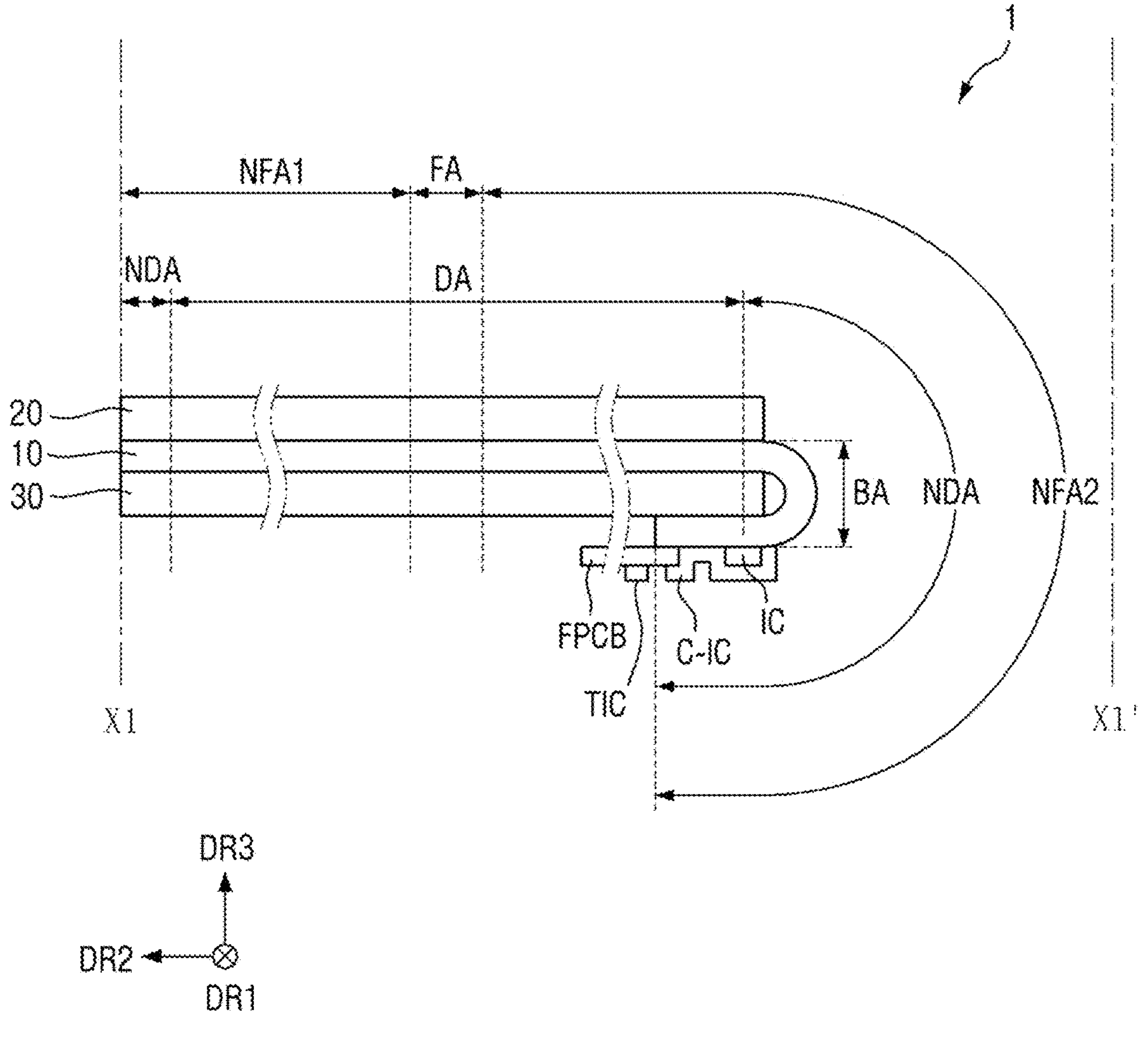
FIG. 3 is a cross-sectional view illustrating a bent state of the display device of FIG. 2.

FIG. 1 is a plan view illustrating a display device according to an embodiment. FIG. 2 is a schematic cross-sectional view illustrating a display device taken along the line X1-X1' of FIG. 1. FIG. 3 is a cross-sectional view illustrating a bent state of the display device of FIG. 2.

Referring to FIGS. 1 to 3, a display device 1 may display a screen and/or an image through a display area DA. The display device 1 may include various suitable devices that include the display area DA. For example, the display device 1 may include a smart phone, a cellular phone, a tablet PC, a personal digital assistant (PDA), a portable multimedia player (PMP), a television, a game machine, a wrist watch kind of electronic device, a head mounted display, a monitor of a personal computer, a laptop computer, a vehicle navigator, a vehicle dashboard, a digital camera, a camcorder, an external advertisement board, an electronic display board, various suitable medical devices, various suitable inspection devices, various suitable home appliances including a display area DA, such as a refrigerator and a washing machine, a device for the Internet of Things (IoT), and/or the like. Some examples of a foldable display device, which will be described in more detail below, may include a foldable smart phone, a tablet PC, or a laptop, but the present disclosure is not limited thereto.

The display device 1 may be formed in a rectangular or substantially rectangular shape on a plane (e.g., in a plan view). The display device 1 may have a rectangular shape having vertical corners (e.g., right-angled corners), or a rectangular shape having rounded corners, on a plane (e.g., in a plan view). Hereinafter, for convenience of illustration, the display device 1 may be described in more detail as having a planar shape including a rectangular shape having rounded corners, but the present disclosure is not limited thereto.

The display device 1 may include four sides and four edges. The number of sides and edges of the display device 1 is not limited thereto. The display device 1 may include long sides and short sides.

The short sides of the display device 1 may be extended along one direction, and the long sides of the display device 1 may be extended along another direction crossing the one direction. For example, the short sides of the display device 1 may be extended along a first direction DR1, and the long sides of the display device 1 may be extended along a second direction DR2.

In the drawings, the first and second directions DR1 and DR2 are horizontal directions that cross each other. For example, the first direction DR1 and the second direction DR2 may be orthogonal to each other. Also, a third direction DR3 crosses the first and second directions DR1 and DR2, and may be, for example, a vertical direction or a thickness direction orthogonal thereto. Hereinafter with respect to the drawings, each of the directions indicated by the arrows in the first to third directions DR1, DR2 and DR3 may be referred to as one side, and its corresponding opposite direction may be referred to as the other side. However, the directions shown in the drawings refer to relative directions, and the present disclosure is not limited to the specific directions shown in the drawings.

The display device 1 may include a display panel 10 for displaying an image, an upper stacked structure 20, a lower stacked structure 30, and an external device attached to the display panel 10. The external device may include a driving chip IC, a printed circuit film FPCB, and a touch driving chip TIC.

The display panel 10 is a panel for displaying a screen and/or an image, and some examples thereof may include a light receiving display panel, such as a liquid crystal display panel and an electrophoretic display panel, as well as a self-light emitting display panel, such as an organic light emitting display panel, an inorganic light emitting display panel, a quantum dot light emitting display panel, a micro LED display panel, a nano LED display panel, a plasma display panel, a field emission display panel, and a cathode-ray display panel.

Hereinafter, an organic light emitting display panel will be described as a representative example of the display panel 10, and the organic light emitting display panel applied to the embodiments will be simply abbreviated as the display panel 10, unless a special distinction is described. However, the present disclosure is not limited to the organic light emitting display panel, and other display panels 10 listed above or known to those having ordinary skill in the art may be applied.

The display panel 10 may include one surface (e.g., an upper surface) and another surface (e.g., a lower surface). Based on the display device 1, a direction from the other surface toward the one surface of the display panel 10 may be a display direction, and a direction from the one surface toward the other surface of the display panel 10 may be a direction in which display is not performed, but the present disclosure is not limited thereto. The direction from the other surface toward the one surface of the display panel 10 and the direction from the one surface toward the other surface of the display panel 10 may be all display directions.

In some embodiments, the display device 1 may be a foldable device. As used herein, the foldable device is a device that may be folded, and includes not only a folded device, but also a device capable of having both a folding state and an unfolding state. Hereinafter, the folding state may be referred to as a first operation state, and the unfolding state may be referred to as a second operation state.

The display panel 10 may include a folding area FA (e.g., a folding axis) and non-folding areas NFA1 and NFA2. The display panel 10 may be folded based on the folding area FA (e.g., the folding axis), and changed from the second operation state to the first operation state.

The folding area FA may have a linear shape extended along the first direction DR1 on a plane (e.g., in a plan view). Although a case in which the folding area FA is extended in parallel with the short side of the display device 1 is illustrated in the drawings, the present disclosure is not limited thereto. The folding area FA may be parallel or substantially parallel with the long side, or may be inclined with respect to the short side and the long side.

The first non-folding area NFA1 and the second non-folding area NFA2 may be areas that are not folded. The first non-folding area NFA1 may be positioned on one side of the folding area FA in the second direction DR2, and the second non-folding area NFA2 may be positioned on the other side of the folding area FA in the second direction DR2.

The display panel 10 may include a display area DA for displaying a picture or an image, and a non-display area NDA that does not display a picture or an image depending on whether an image is displayed.

The display area DA may include a plurality of pixels. A pixel may be a basic unit for displaying a screen. The pixel may include a red pixel, a green pixel and a blue pixel, but the present disclosure is not limited thereto. The pixel may further include a white pixel. The plurality of pixels may be alternately arranged on a plane (e.g., in a plan view). For example, the pixel may be disposed in a matrix direction or arrangement, but the present disclosure is not limited thereto.

The non-display area NDA may be disposed near (e.g., adjacent to) the display area DA. The non-display area NDA may surround (e.g., around a periphery of) the display area DA. In an embodiment, the display area DA may be formed in a rectangular shape, and the non-display area NDA may be disposed near (e.g., adjacent to) four sides of the display area DA.

The rectangular shape of the display area DA may include, for example, short sides extended in the first direction DR1, and long sides extended in the second direction DR2. The non-display area NDA may be disposed near (e.g., adjacent to) the short sides and the long sides of the display area DA. A black matrix may be disposed on the non-display area NDA of the display panel 10 to prevent or substantially prevent light emitted from adjacent pixels from leaking.

The display area DA of the display panel 10 may be disposed over both the first non-folding area NFA1 and the second non-folding area NFA2. Furthermore, the display area DA may be also positioned in the folding area FA corresponding to a boundary between the first non-folding area NFA1 and the second non-folding area NFA2. In other words, the display area DA of the display device 1 may be continuously disposed, regardless of the boundaries of the non-folding areas NFA1 and NFA2, the folding area FA, and the like, but the present disclosure is not limited thereto. For example, in some embodiments, the display area DA may be disposed in the first non-folding area NFA1, but may not be disposed in the second non-folding area NFA2. In other embodiments, the display area DA may be disposed in the first non-folding area NFA1 and the second non-folding area NFA2, but the display area DA may not be disposed in the folding area FA.

The non-display area NDA may be also positioned in the first non-folding area NFA1, the second non-folding area NFA2, and the folding area FA.

In some embodiments, the display device 1 may be folded in an in-folding manner, in which one surface of the display panel 10 is folded so that the folded surfaces face each other, in the first operation state. In the first operation state, one surface of the first non-folding area NFA1 of the display panel 10 may be folded to face one surface of the second non-folding area NFA2.

In another embodiment, the display device 1 may be folded in an out-folding manner, in which another surface of the display panel 10 is folded so that the folded surfaces face each other, in the first operation state. In the first operation state, the other surface of the first non-folding area NFA1 of the display panel 10 may be folded to face the other surface of the second non-folding area NFA2.

The display device 1 may be folded in one (e.g., in only one) of the in-folding manner or the out-folding manner, or may be folded in both the in-folding manner and the out-folding manner. In case of both the in-folding and out-folding manners are performed, the in-folding and the out-folding may be performed based on the same folding area FA, or the display device 1 may include a plurality of folding areas FA in which different kinds of folding may be performed, such as an in-folding-only folding line and an out-folding-only folding line.

The non-display area NDA adjacent to the other short side of the display area DA in the second direction DR2 may further include a protrusion protruded toward the other side in the second direction DR2. A width of the protrusion in the first direction DR1 may be smaller than that of the non-display area NDA in the first direction DR1, which is positioned on one side of the protrusion in the second direction DR2. The width of the protrusion in the first direction DR1 may be gradually reduced toward the other side in the second direction DR2, but the present disclosure is not limited thereto.

The protrusion may include a bending area BA. The bending area BA may have a line shape extended in the first direction DR1. The display panel 10 may be bent in a thickness direction (e.g., the third direction DR3) in the bending area BA of the non-display area NDA. As the display panel 10 is bent based on the bending area BA, the other surfaces of the display panel 10 may face each other.

The external device may be attached to the other side of the bending area BA of the protrusion in the second direction DR2. An attachment position of the driving chip IC may be positioned between an attachment position of the printed circuit film FPCB and the bending area BA. In the second operation state, the driving chip IC may be positioned between the printed circuit film FPCB and the display area DA, or between the printed circuit film FPCB and the bending area BA.

The driving chip IC may include a driving integrated circuit to control an application of a data voltage and/or an application of a scan signal to each corresponding pixel. A plurality of driving pads may be disposed at the attachment position of the driving chip IC in the non-display area NDA, and the driving chip IC may be attached to the plurality of driving pads. For example, the driving chip IC may be a display driver.

The printed circuit film FPCB may be provide a data voltage signal, a data voltage application control signal, and/or a scan signal application control signal to the driving chip IC. In addition, the printed circuit film FPCB may provide a high voltage potential signal and a low voltage potential signal to each pixel.

The printed circuit film FPCB may further include a connector CN positioned on the other end in the second direction DR2. The connector CN may be connected to a main circuit board.

A cover tape C-IC may be disposed on the display panel 10, the driving chip IC, and the printed circuit film FPCB. The cover tape C-IC may completely cover the driving chip IC, but the present disclosure is not limited thereto. The cover tape C-IC may cover at least a portion of the printed circuit film FPCB.

The cover tape C-IC may diffuse (e.g., may radiate) heat generated from the driving chip IC and the printed circuit film FPCB to the outside. The cover tape C-IC may be a kind of thermally conductive adhesive tape including (e.g., containing) a heat dissipating material or a phase change material (PCM). For example, the cover tape C-IC may include a heat dissipation layer and an adhesive layer.

The cover tape C-IC may prevent or substantially prevent the driving chip IC and the printed circuit film FPCB from being damaged by an external force. The cover tape C-IC may prevent or substantially prevent static electricity from being generated from the driving chip IC and the printed circuit film FPCB. For example, the cover tape C-IC may include a polyamide film, a PET film, and/or the like.

The touch driving chip TIC may be packaged on the printed circuit film FPCB. The touch driving chip TIC may be connected to a touch sensing unit (e.g., a touch sensing layer or a touch sensing panel) of the display panel 10. The touch driving chip TIC may supply a touch driving signal to a plurality of touch electrodes TEL (e.g., see FIG. 4) of the touch sensing unit, and may sense a change amount of a capacitance between the plurality of touch electrodes. For example, the touch driving signal may be a pulse signal having a suitable frequency (e.g., a predetermined frequency). The touch driving chip TIC may determine whether an input is provided, and may calculate input coordinates based on the change amount of the capacitance between the plurality of touch electrodes. The touch driving chip TIC may be formed of an integrated circuit.

As shown in FIG. 2, the upper stacked structure 20 may be disposed on one surface of the display panel 10, and the lower stacked structure 30 may be disposed on the other surface of the display panel 10. The upper stacked structure 20 and the lower stacked structure 30 may overlap with other portions of the display panel 10 in the third direction DR3, except the protrusion.

In FIG. 1, planar sizes of the upper and lower stacked structures 20 and 30 are illustrated as being larger than those of the other portions of the display panel 10 except for the protrusion, but the present disclosure is not limited thereto. Each of the planar sizes of the upper and lower stacked structures 20 and 30 may be the same or substantially the same as that of the display panel 10, or may be smaller than that of the display panel 10.

As shown in FIG. 2, the upper stacked structure 20 and the lower stacked structure 30 may be disposed at (e.g., in, on, or over) the display area DA and the non-display area NDA of the display panel 10. The upper stacked structure 20 and the lower stacked structure 30 may be disposed at (e.g., in, on, or over) the folding area FA and the non-folding areas NFA1 and NFA2.

As shown in FIG. 3, when the display device 1 is bent based on the bending area BA, the other surfaces of the display panel 10 may be bent to face each other. The driving chip IC, the printed circuit film FPCB, and the cover tape C-IC may be disposed to overlap with the lower stacked structure 30 in the thickness direction. For example, the driving chip IC, the printed circuit film FPCB, and the cover tape C-IC may be disposed on a lower portion (e.g., a lower surface or a rear surface) of the lower stacked structure 30.

Figure 4:
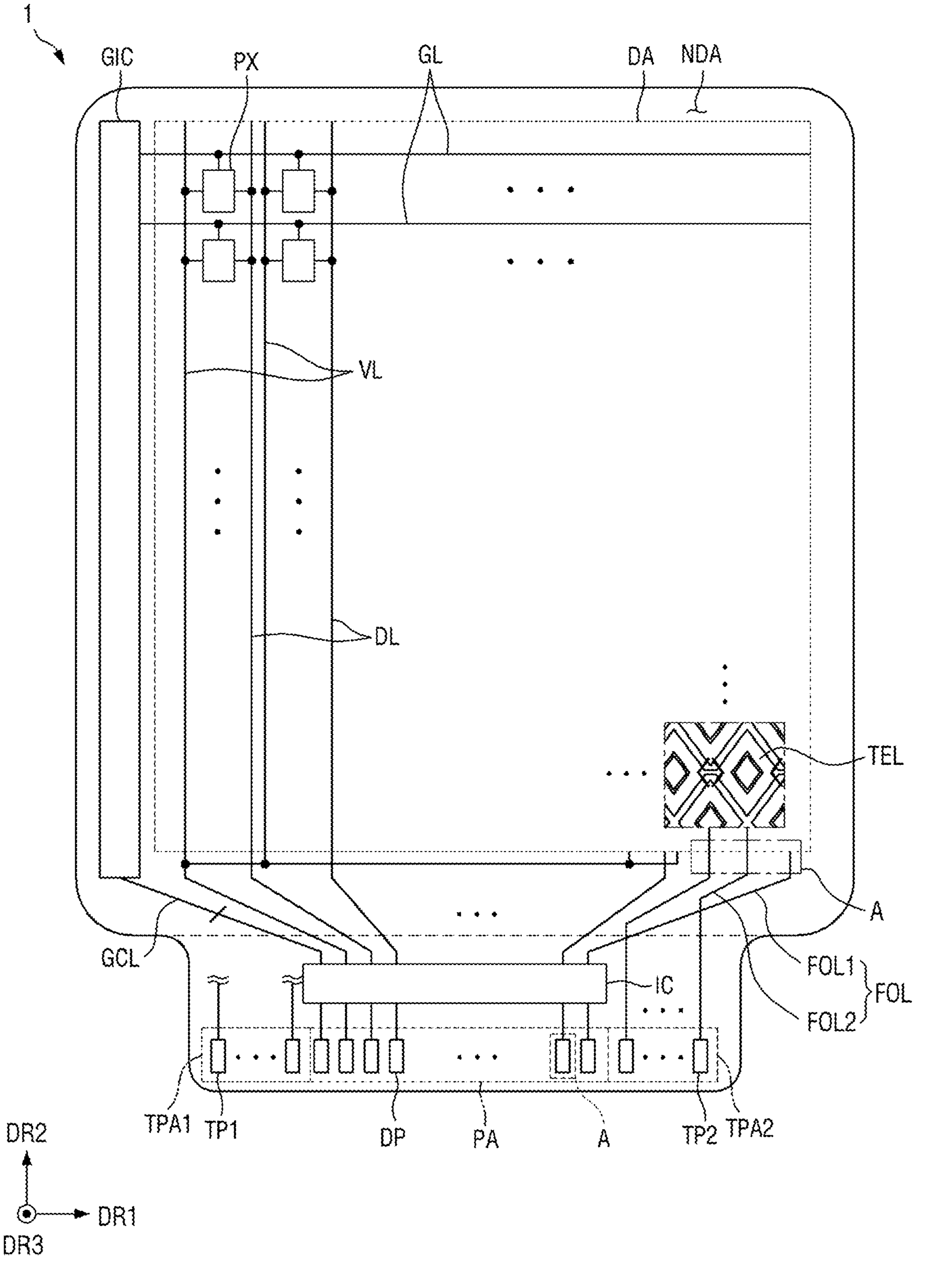
FIG. 4 is a plan view illustrating lines and pads of a display device according to an embodiment.

FIG. 4 is a plan view illustrating lines and pads of a display device according to an embodiment.

Referring to FIG. 4, the display area DA may be positioned at the center of the display panel 10. A plurality of pixels PX, a plurality of gate lines GL, a plurality of data lines DL, a plurality of power lines VL, and a plurality of touch electrodes TEL may be disposed in the display area DA. Each of the plurality of pixels PX may be defined as a minimum unit for emitting light.

The plurality of gate lines GL may supply a gate signal received from a gate driver GIC to the plurality of pixels PX. The plurality of gate lines GL may be extended in the first direction DR1, and may be spaced apart from each other in the second direction DR2 crossing the first direction DR1.

The plurality of data lines DL may supply a data voltage received from the driving chip IC to the plurality of pixels PX. The plurality of data lines DL may be extended in the second direction DR2, and may be spaced apart from each other in the first direction DR1.

The plurality of power lines VL may supply a power voltage received from the driving chip IC to the plurality of pixels PX. In this case, the power voltage may be at least one of a driving voltage, an initialization voltage, a reference voltage, or a low potential voltage. The plurality of power lines VL may be extended in the second direction DR2, and may be spaced apart from each other in the first direction DR1.

The plurality of touch electrodes TEL may form mutual capacitances to sense a touch of an object or a person. The plurality of touch electrodes TEL may include a plurality of driving electrodes and a plurality of sensing electrodes. For example, the driving electrode may be defined as a first sensing electrode, and the sensing electrode may be defined as a second sensing electrode. As another example, the driving electrode may be defined as a second sensing electrode, and the sensing electrode may be defined as a first sensing electrode.

The non-display area NDA may surround (e.g., around a periphery of) the display area DA. The gate driver GIC, fan-out lines FOL, and gate control lines GCL may be disposed in the non-display area NDA. The gate driver GIC may generate a plurality of gate signals based on a gate control signal, and may sequentially supply the plurality of gate signals to the plurality of gate lines GL in accordance with a suitable order (e.g., a predetermined order).

The fan-out lines FOL may be extended from a pad area PA and touch pad areas TPA1 and TPA2 to the display area DA. The fan-out lines FOL may include first fan-out lines FOL1 and second fan-out lines FOL2.

The first fan-out lines FOL1 may be extended from the pad area PA to the display area DA via the driving chip IC. The first fan-out lines FOL1 may supply the data voltage received from the driving chip IC to the plurality of data lines DL. The second fan-out lines FOL2 may be extended from the touch pad areas TPA1 and TPA2 to the display area DA. The second fan-out lines FOL2 may provide the touch driving signal provided from the touch driving chip TIC to the touch electrodes TEL.

The gate control line GCL may be extended from the driving chip IC to the gate driver GIC. The gate control line GCL may supply the gate control signal received from the driving chip IC to the gate driver GIC.

The protrusion of the non-display area NDA may include the driving chip IC, the pad area PA, and the touch pad areas TPA1 and TPA2.

The driving chip IC may output signals and voltages for driving the display panel 10 to the first fan-out lines FOL1. The driving chip IC may supply the data voltage to the data lines DL through the first fan-out lines FOL. The data voltage may be supplied to the plurality of pixels PX, and may control a luminance of the plurality of pixels PX. The driving chip IC may supply the gate control signal to the gate driver GIC through the gate control line GCL.

The pad area PA and the touch pad areas TPA1 and TPA2 may be disposed at an edge of the protrusion of the non-display area NDA. For example, the pad area PA and the touch pad areas TPA1 and TPA2 may be disposed to be adjacent to the other end of the protrusion of the non-display area NDA in the second direction DR2. The pad area PA and the touch pad areas TPA1 and TPA2 may be electrically connected to the printed circuit film FPCB through a bonding member.

The pad area PA may include a plurality of display pad portions DP. The plurality of display pad portions DP may be connected to a graphics system through the printed circuit film FPCB. The plurality of display pad portions DP may be connected to the printed circuit film FPCB to receive digital video data from the graphics system, and may supply the digital video data to the driving chip IC.

The touch pad areas TPA1 and TPA2 may include a first touch pad area TPA1 and a second touch pad area TPA2. The first touch pad area TPA1 may include a plurality of first touch pads TP1, and the second touch pad area TPA2 may include a plurality of second touch pads TP2.

The plurality of first touch pads TP1 and the plurality of second touch pads TP2 may be connected to the touch driving chip TIC through the printed circuit film FPCB. The plurality of first touch pads TP1 and the plurality of second touch pads TP2 may be connected to the printed circuit film FPCB to receive the touch driving signal from the touch driving chip TIC.

The plurality of first touch pads TP1 and the plurality of second touch pads TP2 may provide the touch driving signal provided from the touch driving chip TIC to the touch electrodes TEL through the second fan-out lines FOL2. The plurality of first touch pads TP1 and the plurality of second touch pads TP2 may provide a touch sensing signal sensed from the touch electrodes TEL to the touch driving chip TIC through the second fan-out lines FOL2.

Figure 5:
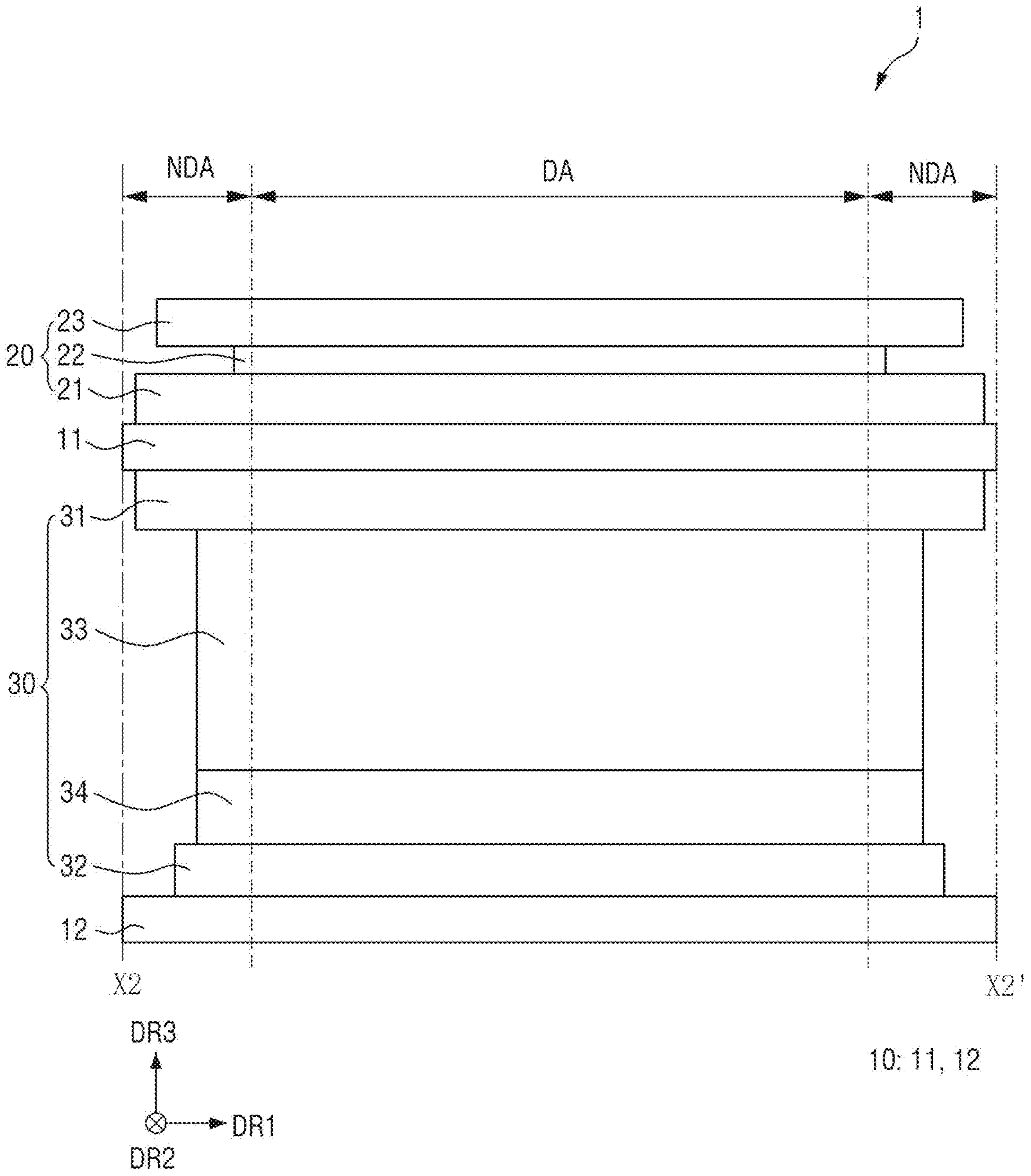
FIG. 5 is a schematic cross-sectional view illustrating a display device taken along the line X2-X2' of FIG. 1.

FIG. 5 is a schematic cross-sectional view illustrating a display device taken along the line X2-X2' of FIG. 1.

Referring to FIG. 5 along with FIGS. 2 and 3, the display device 1 may include a display panel 10, an upper stacked structure 20, and a lower stacked structure 30. The upper stacked structure 20 may include a panel upper member 21, a window member 22, and an upper protective member 23. The lower stacked structure 30 may include a first panel support film 31, a second panel support film 32, a lower function member 33, and a cover spacer 34.

The display panel 10 may include a first portion 11 and a second portion 12. The first portion 11 may be disposed between the upper stacked structure 20 and the lower stacked structure 30. The second portion 12 may be disposed below the lower stacked structure 30.

The second portion 12 may be a portion where the display panel 10 is bent, and then positioned below (e.g., underneath) the lower stacked structure 30 as shown in FIG. 3. In FIG. 5, the first portion 11 and the second portion 12 are shown as separate elements from each other, but as shown in FIG. 3, the first portion 11 and the second portion 12 may be elements connected to one.

The panel upper member 21 may be disposed on an entire surface of the display panel 10. For example, the panel upper member 21 may be disposed on the first portion 11 of the display panel 10.

In an embodiment, the panel upper member 21 may be a protective member. The panel upper member 21 may perform an impact mitigation function for protecting the display panel 10 from external impacts. The panel upper member 21 may include a suitable material having a high flexibility and a high rigidity. For example, the panel upper member 21 may include a flexible plastic material, such as polyimide (PI) and/or polyethylene terephthalate (PET).

In another embodiment, the panel upper member 21 may be an optical member. The panel upper member 21 may perform an anti-reflection function. The panel upper member 21 may reduce a reflectance of external light incident from an upper side of the window member 22. In an embodiment, the panel upper member 21 may include a phase retarder, a polarizer, and a destructive interference structure. For example, the phase retarder and the polarizer may be film types or liquid crystal coating types. The destructive interference structure may include a first reflective layer and a second reflective layer, which are disposed at (e.g., in or on) different layers from each other. First reflective light and second reflective light, which are respectively reflected from the first reflective layer and the second reflective layer, may be subjected to a destructive interference, whereby reflectance of external light may be reduced.

When the panel upper member 21 performs an impact mitigating function or an anti-reflection function, the panel upper member 21 may further include an adhesive layer below (e.g., underneath) a functional layer for performing the impact mitigating function or the anti-reflection function. The adhesive layer may include a transparent adhesive, such as a pressure sensitive adhesive (PSA), an optically clear adhesive (OCA), and/or an optically clear resin (OCR). The panel upper member 21 may be transported and processed by integrally combining the functional layer and the adhesive layer with each other.

In another embodiment, the panel upper member 21 may be an adhesive member. The panel upper member 21 may perform an adhesive function. The panel upper member 21 may connect (e.g., couple or attach) the window member 22 to the display panel 10. For example, the panel upper member 21 may include an adhesive layer (e.g., only an adhesive layer) for performing an adhesive function, and may not include a functional layer for performing the impact mitigation function or the anti-reflection function. In this case, the panel upper member 21 may be formed of a transparent adhesive, such as a pressure sensitive adhesive (PSA), an optically clear adhesive (OCA), and/or an optically clear resin (OCR).

The window member 22 may be attached on an entire or substantially entire surface of the panel upper member 21. The window member 22 may include (e.g., may be made of) a transparent material, such as, for example, glass or plastic. For example, the window member 22 may include (e.g., may be) an ultra-thin glass (UTG) having a thickness of 0.1 mm or less, or a transparent polyimide film.

The upper protective member 23 may be disposed on an entire or substantially entire surface of the window member 22. The upper protective member 23 may perform at least one function from among shock absorption, anti-scratch, anti-fingerprinting, anti-glare, or anti-scattering of the window member 200. The upper protective member 23 may include a suitable material that has a high flexibility and is resistant to scratches. For example, the upper protective member 23 may be a polymer film or a reinforced glass film.

The first panel support film 31 may be disposed on a rear surface of the first portion 11 of the display panel 10. The first panel support film 31 may serve to support the first portion 11 of the display panel 10, and may protect the rear surface of the first portion 11 of the display panel 10. The first panel support film 31 may include (e.g., may be) a plastic, such as polyethylene terephthalate (PET) or polyimide.

The second panel support film 32 may be disposed on a rear surface of the second portion 12 of the display panel 10 (e.g., before the display panel 10 is bent). For example, the second panel support film 32 may be disposed on the rear surface of the second portion 12, and then may be bent as shown in FIG. 3 so that the second portion 12 and the second panel support film 32 are provided on a rear surface of the lower function member 33. The second panel support film 32 may support the second portion 12 of the display panel 10, and may serve to protect the rear surface of the second portion 12 of the display panel 10. The second panel support film 32 may include (e.g., may be) a plastic, such as polyethylene terephthalate (PET) or polyimide.

The lower function member 33 may be disposed on a rear surface of the first panel support film 31. The lower function member 33 may include at least one of a support layer for adding a rigidity to the display panel 10, a light shielding layer for absorbing light incident from the outside, a buffer layer for absorbing an impact from the outside, or a heat dissipation layer for efficiently dissipating heat of the display panel 10.

The support layer may support the display panel 10. The support layer may be a rigid member of which a shape or a volume thereof is not changed easily by an external pressure. In an embodiment, the support layer may include (e.g., may be) a polymer that includes a carbon fiber or a glass fiber. When the lower function member 33 includes a digitizer, the support layer may be formed of a polymer that includes a carbon fiber or a glass fiber, to pass through a magnetic field or an electromagnetic signal of the digitizer.

In another embodiment, the support layer may be a metal plate. For example, the support layer may be a metal plate including (e.g., made of) a metal or a metal alloy. The support layer may include copper (Cu), aluminum (Al), stainless (SUS), and/or a suitable alloy thereof, but the present disclosure is not limited thereto.

The light shielding layer may shield a transmission of light to prevent or substantially prevent the elements disposed therebelow from being visually recognized on the display panel 10. The light shielding layer may include a light absorbing material, such as a black pigment or a black dye.

The buffer layer may absorb an external impact to prevent or substantially prevent the display panel 10 from being damaged. The buffer layer may be formed of a single layer or a plurality of layers. For example, the buffer layer may include (e.g., may be formed of) a polymer resin, such as polyurethane, polycarbonate, polypropylene, and/or polyethylene, or may include a suitable material having an elasticity, such as rubber, a urethane-based material, or a sponge formed by foaming an acrylic-based material.

The heat dissipation layer may include a first heat dissipation layer including (e.g., containing) a graphite or carbon nanotube, and a second heat dissipation layer including (e.g., formed of) a metal thin film, such as copper, nickel, ferrite, and/or silver, which may be capable of shielding electromagnetic waves and may have excellent thermal conductivity.

The cover spacer 34 may uniformly or substantially uniformly maintain a distance between the lower function member 33 and the second portion 12 of the display panel 10 in the third direction DR3 when the display panel 10 is bent. The cover spacer 34 may control a degree of bending (e.g., a curve or a curvature) of the display panel 10. The cover spacer 34 may support the second portion 12 of the display panel 10. The cover spacer 34 may include an organic insulating material, but the present disclosure is not limited thereto.

Figure 6A:
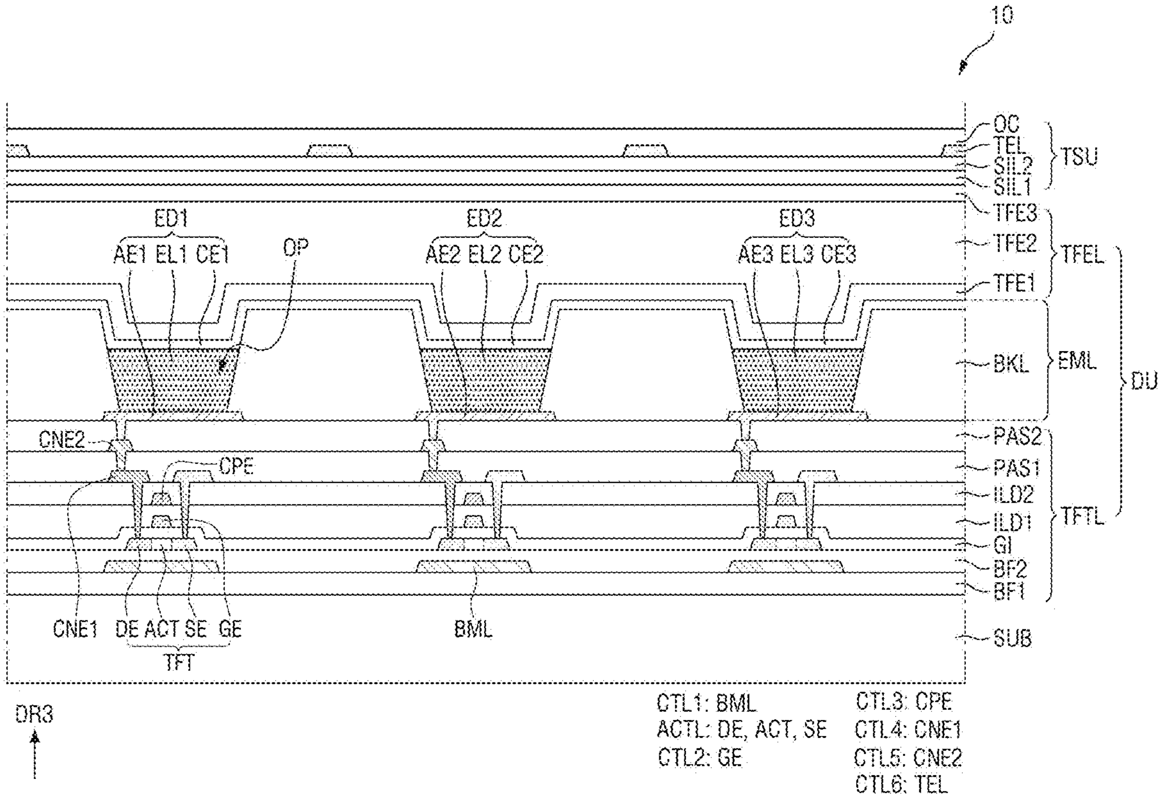
FIG. 6A is a cross-sectional view illustrating a display panel according to an embodiment.
Figure 6B:
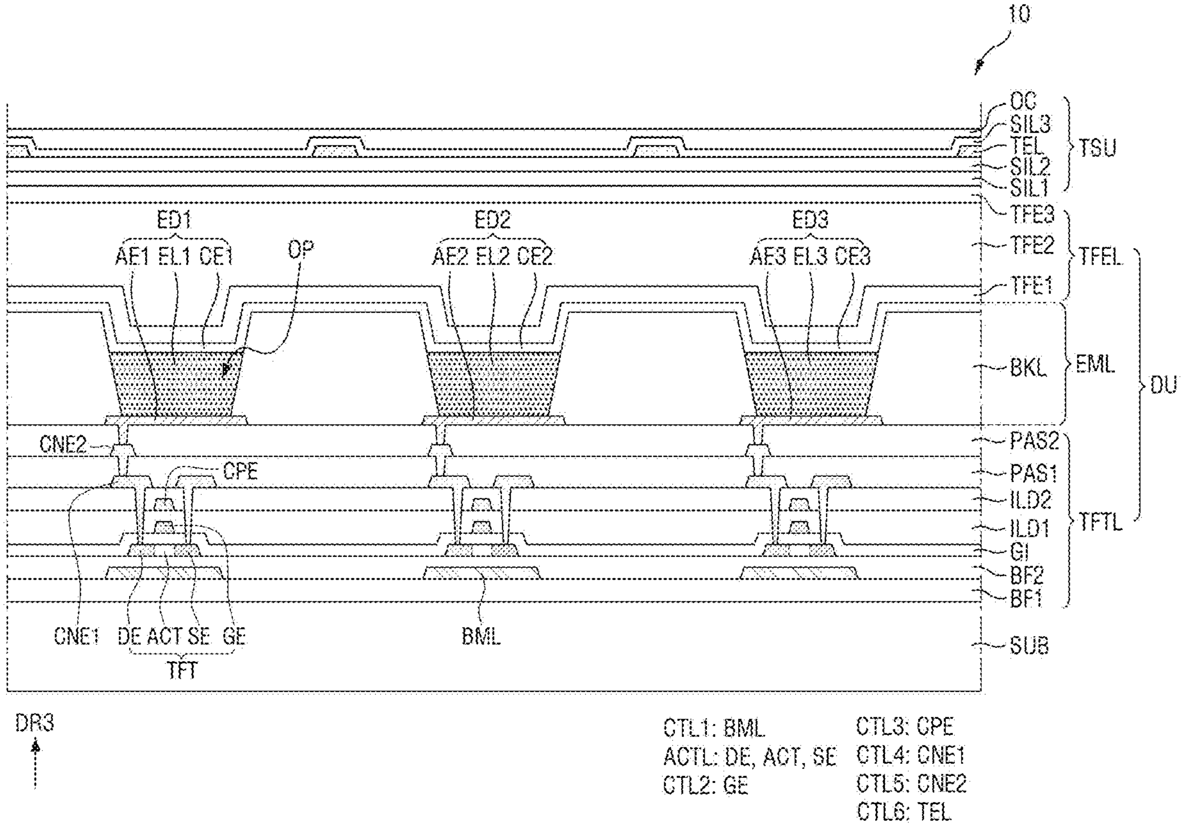
FIG. 6B is a cross-sectional view illustrating a display panel according to another embodiment.

FIG. 6A is a cross-sectional view illustrating a display panel according to an embodiment. FIG. 6B is a cross-sectional view illustrating a display panel according to another embodiment.

Referring to FIGS. 6A and 6B, the display panel 10 may include a substrate SUB, a display layer DU, and a touch sensing layer TSU. The display layer DU may include a thin film transistor layer TFTL, a light emitting element layer EML, and a thin film encapsulation layer TFEL.

The substrate SUB may be a base substrate or a base member. The substrate SUB may be a flexible substrate capable of being subjected to bending, folding, rolling, and/or the like. For example, the substrate SUB may include a polymer resin such as polyimide (PI), but the present disclosure is not limited thereto. As another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The thin film transistor layer TFTL may include a first conductive layer CTL1, an active layer ACTL, a second conductive layer CTL2, a third conductive layer CTL3, a fourth conductive layer CTL4, and a fifth conductive layer CTL5.

As used herein, a conductive layer is a layer having a conductivity by including a conductive material, and layers formed of the conductive layers of the same name may be formed by the same process and/or may include the same material as each other. In an embodiment, the insulating layers or the passivation layers, which are directly positioned on upper and lower portions of the same conductive layer, may be the same as each other. However, when the insulating layers or the passivation layers, which are directly positioned on upper and lower portions of the same conductive layer, are omitted in some areas, they may not be the same as each other.

The first buffer layer BF1 may be disposed on the substrate SUB. The first buffer layer BF1 may include an inorganic layer capable of preventing or substantially preventing the permeation of air and/or moisture. For example, the first buffer layer BF1 may include a plurality of inorganic layers that are alternately stacked.

The first conductive layer CTL1 may be disposed on the first buffer layer BF1. The first conductive layer CTL1 may include the lower metal layer BML. The lower metal layer BML may include a suitable material for shielding light, thereby preventing or substantially preventing light from being incident on a semiconductor area ACT. For example, the lower metal layer BML may be formed of a single layer or multi-layers, which may include (e.g., may be made of) any one or more of molybdenum (Mo), aluminum (Al), chromium (Cr), gold (Au), titanium (Ti), nickel (Ni), neodymium (Nd), copper (Cu), or a suitable alloy thereof. In some embodiments, the lower metal layer BML may be omitted as needed or desired.

The second buffer layer BF2 may be disposed on the first conductive layer CTL1. The second buffer layer BF2 may cover the first buffer layer BF1 and the lower metal layer BML. The second buffer layer BF2 may include an inorganic layer capable of preventing or substantially preventing the permeation of air and/or moisture. For example, the second buffer layer BF2 may include a plurality of inorganic layers that are alternately stacked.

The thin film transistor TFT may be disposed on the second buffer layer BF2. The thin film transistor TFT may constitute a pixel circuit of a corresponding one of the plurality of pixels. In other words, a pixel circuit of each corresponding pixel may include at least one thin film transistor TFT. For example, the thin film transistor TFT may be a driving transistor or a switching transistor of the pixel circuit. The thin film transistor TFT may include a semiconductor area ACT, a source electrode SE, a drain electrode DE, and a gate electrode GE. However, a connection electrode CNE, which will be described in more detail below, may be also be considered as an element included in the thin film transistor TFT.

The active layer ACTL may be disposed on the second buffer layer BF2. The active layer ACTL may include the semiconductor area ACT, the drain electrode DE, and the source electrode SE.

The semiconductor area ACT may overlap with the lower metal layer BML and the gate electrode GE in the thickness direction. The semiconductor area ACT may be insulated from the gate electrode GE by the gate insulating layer GI. A material of the semiconductor area ACT may be made conductive in a portion of the semiconductor area ACT to form the source electrode SE and the drain electrode DE.

The gate insulating layer GI may be disposed on the active layer ACTL. The gate insulating layer GI may cover the semiconductor area ACT and the second buffer layer BF2. The gate insulating layer GI may insulate the semiconductor area ACT from the gate electrode GE. The gate insulating layer GI may include a contact hole through which the first connection electrode CNE1 passes (e.g., penetrates).

The second conductive layer CTL2 may be disposed on the gate insulating layer GI. The second conductive layer CTL2 may include the gate electrode GE. The gate electrode GE may overlap with the semiconductor area ACT with the gate insulating layer GI interposed therebetween.

The first interlayer insulating layer ILD1 may be disposed on the second conductive layer CTL2. The first interlayer insulating layer ILD1 may cover the gate electrode GE and the gate insulating layer GI. The first interlayer insulating layer ILD1 may include a contact hole through which the first connection electrode CNE1 passes (e.g., penetrates). The contact hole of the first interlayer insulating layer ILD1 may be connected to the contact hole of the gate insulating layer GI and a contact hole of the second interlayer insulating layer ILD2.

The third conductive layer CTL3 may be disposed on the first interlayer insulating layer ILD1. The third conductive layer CTL3 may include the capacitor electrode CPE. The capacitor electrode CPE may overlap with the gate electrode GE in the thickness direction. The capacitor electrode CPE and the gate electrode GE may form a capacitance.

The second interlayer insulating layer ILD2 may be disposed on the third conductive layer CTL3. The second interlayer insulating layer ILD2 may cover the capacitor electrode CPE and the first interlayer insulating layer ILD1. The second interlayer insulating layer ILD2 may include a contact hole through which the first connection electrode CNE1 passes (e.g., penetrates). The contact hole of the second interlayer insulating layer ILD2 may be connected to the contact hole of the first interlayer insulating layer ILD1 and the contact hole of the gate insulating layer GI.

The fourth conductive layer CTL4 may be disposed on the second interlayer insulating layer ILD2. The fourth conductive layer CTL4 may include the first connection electrode CNE1. The first connection electrode CNE1 may electrically connect the source electrode SE or the drain electrode DE of the thin film transistor TFT to the second connection electrode CNE2. The first connection electrode CNE1 may be inserted into the contact holes formed in the second interlayer insulating layer ILD2, the first interlayer insulating layer ILD1, and the gate insulating layer GI to contact the source electrode SE or the drain electrode DE of the thin film transistor TFT. In some embodiments, the first connection electrode CNE1 may be also considered as an element included in the thin film transistor TFT. In an embodiment, the first connection electrode CNE1 may perform the same or substantially the same function as that of the source electrode SE or the drain electrode DE of the thin film transistor TFT.

The first passivation layer PAS1 may be disposed on the fourth conductive layer CTL4. The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes (e.g., penetrates).

The fifth conductive layer CTL5 may be disposed on the first passivation layer PAS1. The fifth conductive layer CTL5 may include the second connection electrode CNE2. The second connection electrode CNE2 may electrically connect the first connection electrode CNE1 with a corresponding one of pixel electrodes AE1, AE2, and AE3 of light emitting elements ED1, ED2, and ED3. The second connection electrode CNE2 may be inserted into the contact hole formed in the first passivation layer PAS1 to contact the first connection electrode CNE1. In some embodiments, the second connection electrode CNE2 may also be considered as an element included in the thin film transistor TFT. In an embodiment, the second connection electrode CNE2 may perform the same or substantially the same function as that of the source electrode SE or the drain electrode DE of the thin film transistor TFT.

The second passivation layer PAS2 may be disposed on the fifth conductive layer CTL5. The second passivation layer PAS2 may cover the second connection electrode CNE2 and the first passivation layer PAS1. The second passivation layer PAS2 may include contact holes through which the pixel electrodes AE1, AE2, and AE3 of the light emitting elements ED1, ED2, and ED3 pass (e.g., penetrate).

The light emitting element layer EML may be disposed on the thin film transistor layer TFTL. The light emitting element layer EML may include the light emitting elements ED1, ED2, and ED3 and a bank layer BKL. The light emitting elements ED1, ED2, and ED3 may include the pixel electrodes AE1, AE2, and AE3, light emitting layers EL1, EL2, and EL3, and common electrodes CE1, CE2, and CE3.

The pixel electrodes AE1, AE2, and AE3 may be disposed on the second passivation layer PAS2. Each of the pixel electrodes AE1, AE2, and AE3 may be disposed to overlap with any one of openings OP of the bank layer BKL. The pixel electrodes AE1, AE2, and AE3 may be electrically connected to the source electrodes SE or the drain electrodes DE of the thin film transistors TFT through the first and second connection electrodes CNE1 and CNE2.

In an embodiment, the pixel electrodes AE1, AE2, and AE3 may include a first pixel electrode AE1, a second pixel electrode AE2, and a third pixel electrode AE3, which are disposed for each pixel PX. The first pixel electrode AE1, the second pixel electrode AE2, and the third pixel electrode AE3 may be disposed to be spaced apart from one another on the second passivation layer PAS2. In some embodiments, the pixel electrodes AE1, AE2, and AE3 may respectively constitute the light emitting elements ED1, ED2, and ED3 for emitting light of different colors from each other.

The light emitting layers EL1, EL2, and EL3 may be disposed on the pixel electrodes AE1, AE2, and AE3.

In an embodiment, the light emitting layers EL1, EL2, and EL3 may be organic light emitting layers including (e.g., made of) organic materials. In the light emitting layers EL1, EL2, and EL3, when the corresponding thin film transistors TFT apply a voltage (e.g., a predetermined voltage) to the pixel electrodes AE1, AE2, and AE3 of the light emitting elements ED1, ED2, and ED3, and the common electrodes CE1, CE2, and CE3 of the light emitting elements ED1, ED2, and ED3 receive a common voltage or a cathode voltage, holes and electrons may move to the light emitting layers EL1, EL2, and EL3 through a hole transport layer and an electron transport layer, respectively, and may be combined with each other in the light emitting layers EL1, EL2, and EL3 to emit light.

In another embodiment, the light emitting devices ED1, ED2, and ED3 may include a quantum dot light emitting diode including a quantum dot light emitting layer, an inorganic light emitting diode including an inorganic semiconductor, or a micro light emitting diode.

The light emitting layers EL1, EL2, and EL3 may include a first light emitting layer EL1, a second light emitting layer EL2, and a third light emitting layer EL3. The first light emitting layer EL1 may be disposed on the first pixel electrode AE1, the second light emitting layer EL2 may be disposed on the second pixel electrode AE2, and the third light emitting layer EL3 may be disposed on the third pixel electrode AE3. The first to third light emitting layers EL1, EL2, and EL3 may be light emitting layers of the first to third light emitting elements ED1, ED2, and ED3, respectively.

In some embodiments, the first light emitting layer EL1 may emit red light of a first color, the second light emitting layer EL2 may emit green light of a second color, and the third light emitting layer EL3 may emit blue light of a third color, but the present disclosure is not limited thereto.

The common electrodes CE1, CE2, and CE3 may be disposed on the light emitting layers EL1, EL2, and EL3.

The common electrodes CE1, CE2, and CE3 may include a transparent conductive material so that light generated from the light emitting layers EL1, EL2, and EL3 may be transmitted therethrough. The common electrodes CE1, CE2, and CE3 may receive a common voltage or a low potential voltage. When the pixel electrodes AE1, AE2, and AE3 receive a voltage corresponding to the data voltage and the common electrodes CE1, CE2, and CE3 receive a low potential voltage, a potential difference is formed between the pixel electrodes AE1, AE2, and AE3 and the common electrodes CE1, CE2, and CE3, so that the light emitting layers EL1, EL2, and EL3 may emit light.

The common electrodes CE1, CE2, and CE3 may include a first common electrode CE1, a second common electrode CE2, and a third common electrode CE3. The first common electrode CE1 may be disposed on the first light emitting layer EL1, the second common electrode CE2 may be disposed on the second light emitting layer EL2, and the third common electrode CE3 may be disposed on the third light emitting layer EL3. However, as shown in the drawings, the common electrodes CE1, CE2, and CE3 may overlap with the plurality of pixels PX as an integrated electrode, and may be disposed over an entire or substantially entire surface of the display layer DU along the sides and the upper surface of the bank layer BKL and the upper surfaces of the light emitting layers EL1, EL2, and EL3.

The bank layer BKL may be disposed on the thin film transistor layer TFTL or the substrate SUB. The bank layer BKL may include an opening OP disposed for each corresponding pixel PX. The openings OP of the bank layer BKL may partition light emission areas of the light emitting elements ED1, ED2, and ED3. For example, the light emitting elements ED1, ED2, and ED3 may overlap with the openings OP of the bank layer BKL, respectively.

In some embodiments, the openings OP of the bank layer BKL may overlap with the pixel electrodes AE1, AE2, and AE3, and may expose portions of the pixel electrodes AE1, AE2, and AE3 therebelow. For example, the bank layer BKL may cover portions of the pixel electrodes AE1, AE2, and AE3 on both ends (e.g., opposite ends) of the pixel electrodes AE1, AE2, and AE3, and may expose the remaining portions of the pixel electrodes AE1, AE2, and AE3 through the openings OP.

In some embodiments, the light emitting layers EL1, EL2, and EL3 of the light emitting elements ED1, ED2, and ED3 may be disposed in the openings OP of the bank layer BKL, but the present disclosure is not limited thereto. The light emitting layers EL1, EL2, and EL3 may be disposed to be conformal on the bank layer BKL along the sides and the upper surface of the bank layer BKL.

In some embodiments, the common electrodes CE1, CE2, and CE3 may be disposed to be conformal on the bank layer BKL along the sides and the upper surface of the bank layer BKL, but the present disclosure is not limited thereto. The common electrodes CE1, CE2, and CE3 may be disposed in the openings OP of the bank layer BKL.

The thin film encapsulation layer TFEL may be disposed on the plurality of light emitting elements ED1, ED2, and ED3 and the bank layer BKL, and may cover the plurality of light emitting elements ED1, ED2, and ED3 and the bank layer BKL. The thin film encapsulation layer TFEL may include at least one inorganic layer to prevent or substantially prevent oxygen and/or moisture from being permeated into the light emitting element layer EML. The thin film encapsulation layer TFEL may include at least one organic layer to protect the light emitting element layer EML from particles, such as dust.

The thin film encapsulation layer TFEL may include a first encapsulation layer TFE1, a second encapsulation layer TFE2, and a third encapsulation layer TFE3, which are sequentially stacked. The first encapsulation layer TFE1 and the third encapsulation layer TFE3 may be inorganic encapsulation layers, and the second encapsulation layer TFE2 disposed therebetween may be an organic encapsulation layer.

Each of the first encapsulation layer TFE1 and the third encapsulation layer TFE3 may include at least one inorganic insulating material. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. The polymer-based material may include an acrylic resin, an epoxy resin, polyimide, polyethylene, and/or the like. For example, the second encapsulation layer TFE2 may include an acrylic resin, for example, such as polymethyl methacrylate, polyacrylic acid, and/or the like. The second encapsulation layer TFE2 may be formed by curing a monomer or coating a polymer.

In an embodiment, the first encapsulation layer TFE1 may be disposed on the common electrodes CE1, CE2, and CE3. The first encapsulation layer TFE1 may be disposed to be conformal along a shape of the common electrodes CE1, CE2, and CE3. The second encapsulation layer TFE2 may be disposed on the first encapsulation layer TFE1. The second encapsulation layer TFE2 may serve to planarize or substantially planarize a step difference of a lower layer. The third encapsulation layer TFE3 may be disposed on the second encapsulation layer TFE2.

The touch sensing layer TSU may be disposed on the thin film encapsulation layer TFEL. The touch sensing layer TSU may include a first touch insulating layer SIL1, a second touch insulating layer SIL2, a touch electrode TEL, and an overcoat layer OC. The touch sensing layer TSU may include a sixth conductive layer CTL6.

The first touch insulating layer SIL1 may be disposed on the thin film encapsulation layer TFEL. The first touch insulating layer SIL1 may have insulating and optical functions. The first touch insulating layer SIL1 may include at least one inorganic layer. In some embodiments, the first touch insulating layer SIL1 may be omitted as needed or desired.

The second touch insulating layer SIL2 may cover the first touch insulating layer SIL1. In some embodiments, a touch electrode of another layer in addition to the touch electrode TEL disposed on the second insulating layer SIL2 may be further disposed on the first touch insulating layer SIL1. In this case, the second touch insulating layer SIL2 may cover the touch electrode of the other layer. The second touch insulating layer SIL2 may have insulating and optical functions. For example, the second touch insulating layer SIL2 may be an inorganic layer that includes at least one of a silicon nitride layer, a silicon oxynitride layer, a silicon oxide layer, a titanium oxide layer, or an aluminum oxide layer.

The sixth conductive layer CTL6 may be disposed on the second touch insulating layer SIL2. The sixth conductive layer CTL6 may include the touch electrode TEL. The touch electrode TEL may not overlap with the light emitting elements ED1, ED2, and ED3. The touch electrode TEL may be formed of a single layer of molybdenum (Mo), titanium (Ti), copper (Cu), aluminum (Al), or indium tin oxide (ITO), or may be formed of a stacked structure of aluminum and titanium (e.g., Ti/Al/Ti), a stacked structure of aluminum and ITO (e.g., ITO/Al/ITO), an APC alloy, or a stacked structure of an APC alloy and ITO (e.g., ITO/APC/ITO).

The overcoat layer OC may be disposed on the second touch insulating layer SIL2 and the touch electrode TEL. The overcoat layer OC may planarize or substantially planarize upper ends of the second touch insulating layer SIL2 and the touch electrode TEL. The overcoat layer OC may be a colorless light-transmissive layer that does not have a color of a visible light band. For example, the overcoat layer OC may include a colorless light-transmissive organic material such as an acrylic resin.

In some embodiments, as shown in FIG. 6B, the display panel 10 may further include a third touch insulating layer SIL3. The third touch insulating layer SIL3 may be disposed on the touch electrode TEL. The third touch insulating layer SIL3 may be disposed between the touch electrode TEL and the overcoat layer OC. The third touch insulating layer SIL3 may cover the touch electrode TEL and the second touch insulating layer SIL2. The third touch insulating layer SIL3 may have insulating and optical functions. The third touch insulating layer SIL3 may be formed of at least one of the aforementioned materials of the second touch insulating layer SIL2.

Figure 7:
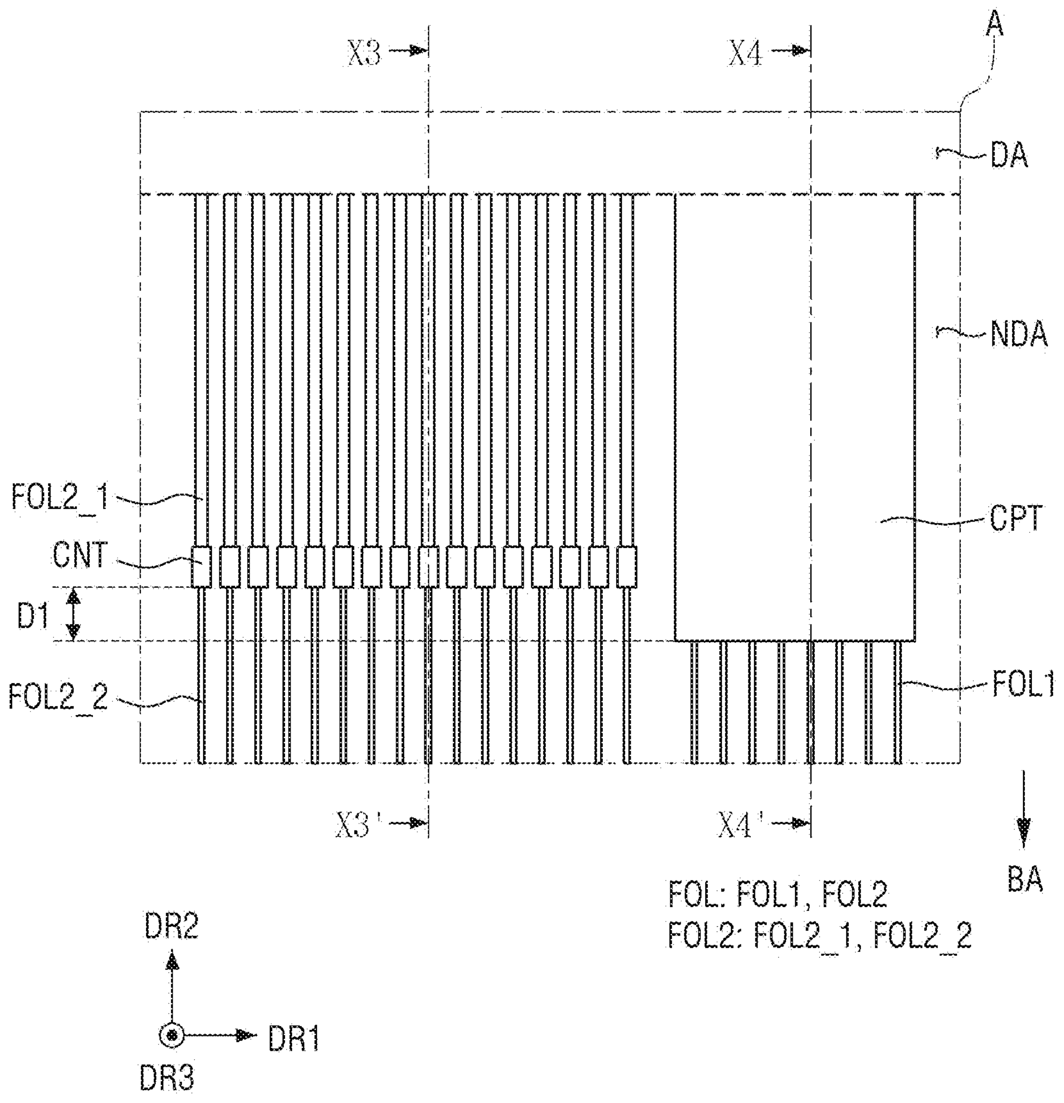
FIG. 7 is an enlarged plan view illustrating the area A of FIG. 4.
Figure 8:
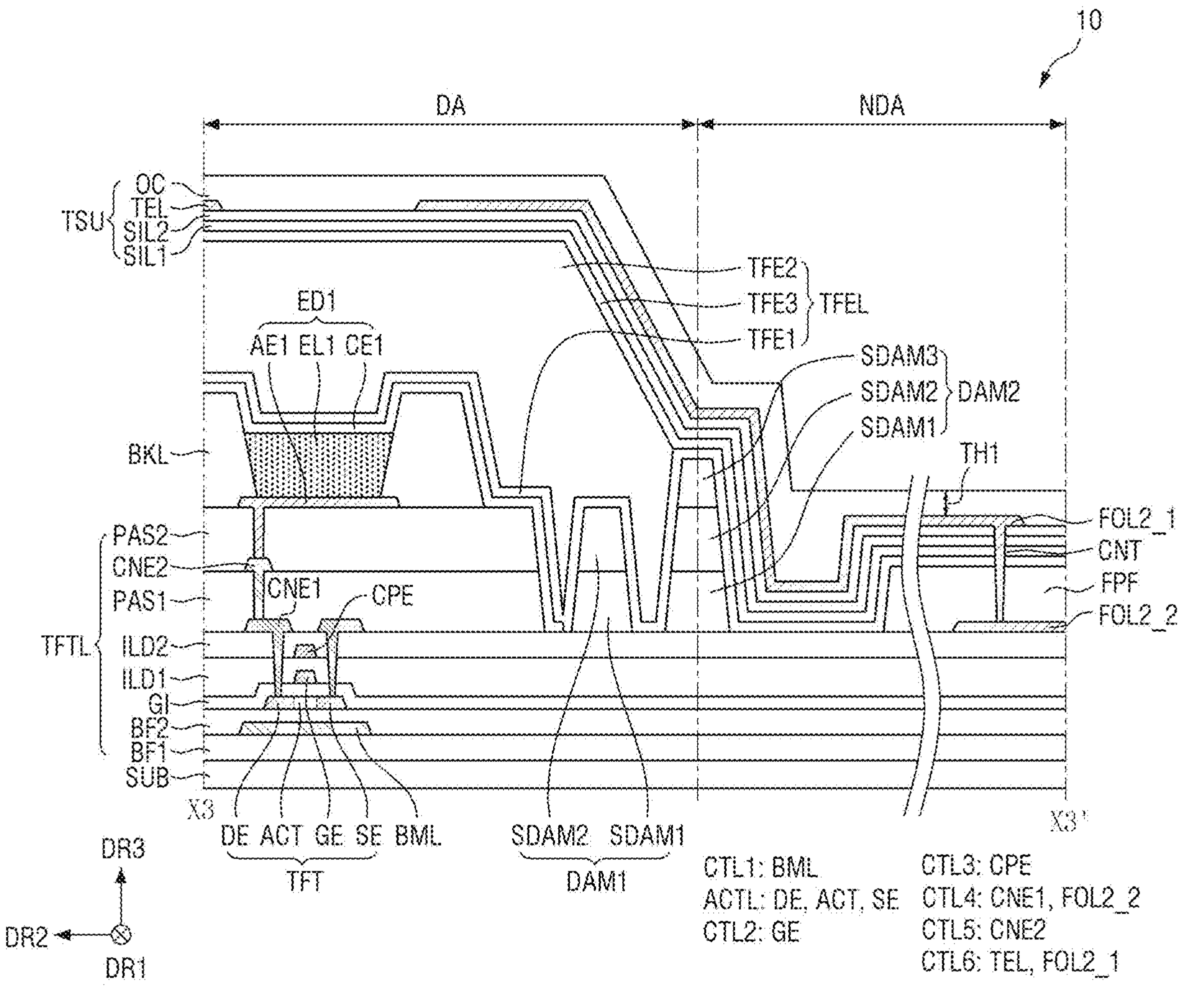
FIG. 8 is a cross-sectional view illustrating a display panel taken along the line X3-X3' of FIG. 7.
Figure 9:
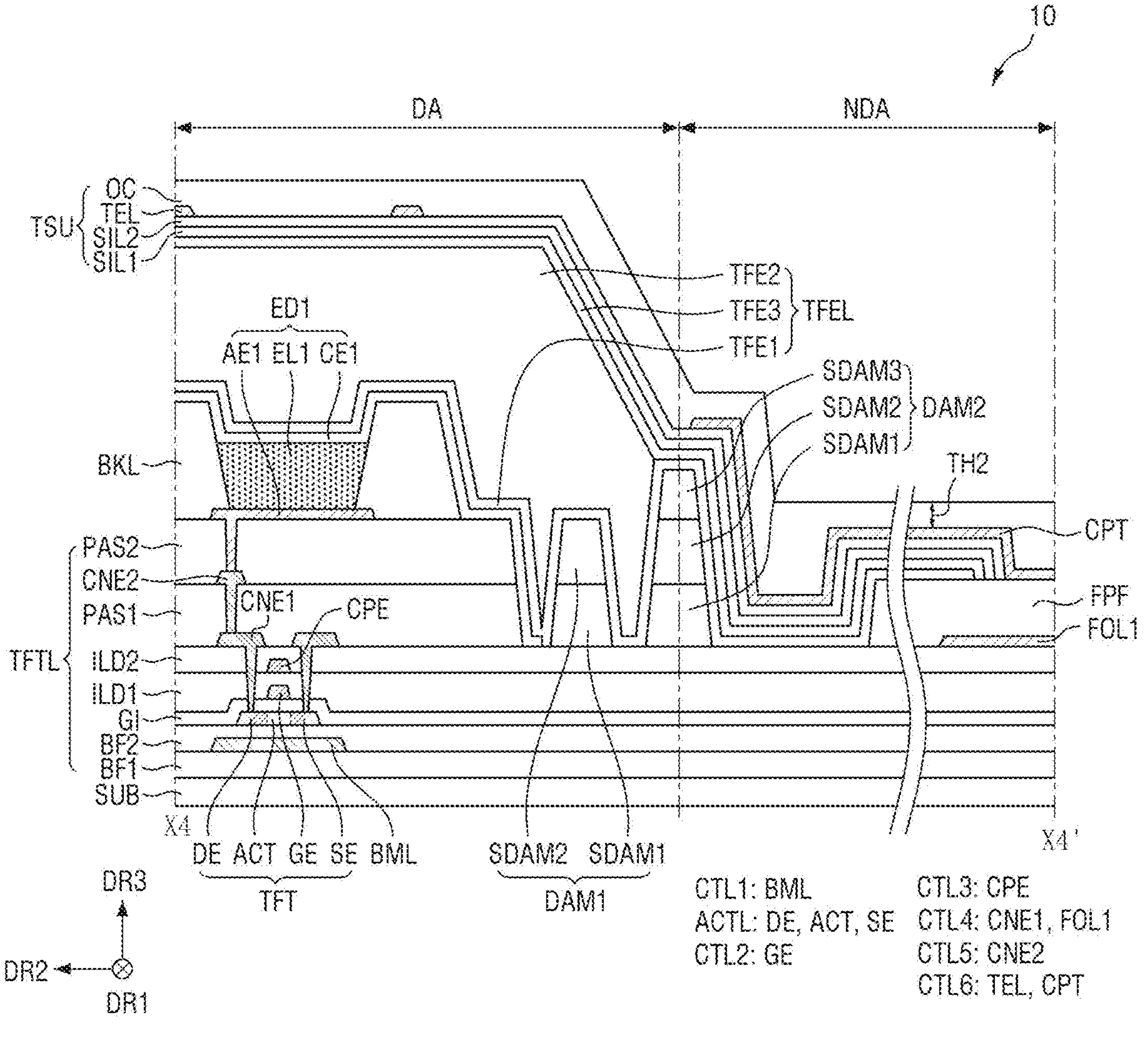
FIG. 9 is a cross-sectional view illustrating a display panel taken along the line X4-X4' of FIG. 7.

FIG. 7 is an enlarged plan view illustrating the area A of FIG. 4. FIG. 8 is a cross-sectional view illustrating a display panel taken along the line X3-X3' of FIG. 7. FIG. 9 is a cross-sectional view illustrating a display panel taken along the line X4-X4' of FIG. 7.

Referring to FIGS. 7 to 9 along with FIG. 4, the fan-out lines FOL may be extended from the display area DA toward the bending area BA of the non-display area NDA. For example, as shown in FIG. 7, the fan-out lines FOL may be extended in the second direction DR2. In FIG. 7, for convenience, the display area DA is omitted and only the fan-out lines FOL are shown. The fan-out lines FOL may be also disposed in the display area DA.

The fan-out lines FOL may include the first fan-out lines FOL1 and the second fan-out lines FOL2. The second fan-out lines FOL2 may include first sub fan-out lines FOL2_1 and second sub fan-out lines FOL2_2.

As described above, the first fan-out lines FOL1 may supply the data voltage received from the driving chip IC to the plurality of data lines DL. The second fan-out lines FOL2 may provide the touch driving signal provided from the touch driving chip TIC to the touch electrodes TEL. The second fan-out lines FOL2 may provide the touch sensing signal sensed from the touch electrodes TEL to the touch driving chip TIC.

The first fan-out lines FOL1 may be disposed at (e.g., in or on) the thin film transistor layer TFTL. For example, as shown in FIG. 9, the first fan-out lines FOL1 may be disposed at (e.g., in or on) the fourth conductive layer CTL4 that is the same layer as that of the first connection electrode CNE1, but the present disclosure is not limited thereto. The first fan-out lines FOL1 may be disposed at (e.g., in or on) any one of the first to fifth conductive layers CTL1, CTL2, CTL3, CTL4, and CTL5.

The first sub fan-out lines FOL2_1 may be disposed in the touch sensing layer TSU. For example, as shown in FIG. 8, the first sub fan-out lines FOL2_1 may be disposed in the sixth conductive layer CTL6 that is the same layer as that of the touch electrode TEL, but the present disclosure is not limited thereto. When a touch electrode of another layer is further disposed between the first touch insulating layer SIL1 and the second touch insulating layer SIL2, the first sub fan-out lines FOL2_1 may be disposed in the same layer as that of the touch electrode of another layer. The first sub fan-out lines FOL2_1 may be connected to the touch electrodes TEL in the display area DA.

The second sub fan-out lines FOL2_2 may be disposed in the thin film transistor layer TFTL. For example, as shown in FIGS. 8 and 9, the second sub fan-out lines FOL2_2 may be disposed in the fourth conductive layer CTL4, or in other words, in the same layer as that of the first fan-out lines FOL1, but the present disclosure is not limited thereto. The second sub fan-out lines FOL2_2 may be disposed at (e.g., in or on) any one of the first to fifth conductive layers CTL1, CTL2, CTL3, CTL4, and CTL5. The second sub fan-out lines FOL2_2 may be connected to the touch driving chip TIC (e.g., see FIG. 1) through the touch pads TP1 and TP2 in the non-display area NDA.

In the display device 1 according to the present embodiment, the first sub fan-out lines FOL2_1 may be connected to the second sub fan-out lines FOL2_2 through contact holes CNT. The contact holes CNT may pass through (e.g., may penetrate) insulating films positioned between the first sub fan-out lines FOL2_1 and the second sub fan-out lines FOL2_2.

At least one of the second touch insulating layer SIL2, the first touch insulating layer SIL1, the third encapsulation layer TFE3, the first encapsulation layer TFE1 or a line passivation film FPF may be disposed between the first sub fan-out lines FOL2_1 and the second sub fan-out lines FOL2_2. The second touch insulating layer SIL2, the first touch insulating layer SIL1, the third encapsulation layer TFE3, and the first encapsulation layer TFE1 may be extended from the display area DA to the non-display area NDA, and may be disposed between the first sub fan-out lines FOL2_1 and the second sub fan-out lines FOL2_2.

The line passivation film FPF may be disposed in the non-display area NDA. As shown in FIGS. 8 and 9, the line passivation film FPF may be disposed at (e.g., in or on) the same layer as that of the first passivation layer PAS1, but the present disclosure is not limited thereto. The line passivation film FPF may be disposed at (e.g., in or on) the same layer as that of the second passivation layer PAS2, or as that of the bank layer BKL.

The line passivation film FPF may protect the first fan-out lines FOL1 and the second sub fan-out lines FOL2_2, which are disposed below (e.g., underneath) the line passivation film FPF. For example, the line passivation film FPF may prevent or substantially prevent dust and/or the like from being permeated into the first fan-out lines FOL1 and the second sub fan-out lines FOL2_2, or may prevent or substantially prevent static electricity from flowing thereto. The line passivation film FPF may include an organic film.

In the display device 1 according to the present embodiment, the first sub fan-out line FOL2_1 may be connected to the second sub fan-out line FOL2_2 that is disposed at (e.g., in or on) the same layer as that of the first fan-out line FOL1, and thus, reliability of the display device 1 may be improved.

For example, the second fan-out lines FOL2 connected to the touch driving chip TIC and the first fan-out lines FOL1 connected to the driving chip IC may be disposed at (e.g., in or on) the same layer as each other in an area adjacent to the bending area BA, so that stress applied to the first fan-out lines FOL1 and the second fan-out lines FOL2 during bending of the display panel 10 may be uniformly or substantially uniformly maintained. Therefore, electrical characteristics of the first fan-out lines FOL1 and the second fan-out lines FOL2 may be uniformly or substantially uniformly maintained. As a result, reliability of the display device 1 may be improved.

The display device 1 may further include a protective pattern CPT. The protective pattern CPT may be extended from the display area DA toward the non-display area NDA. For example, the protective pattern CPT may be extended in the second direction DR2. Although the protective pattern CPT is shown only in the non-display area NDA in the drawings, the display area DA is omitted from the drawings for convenience of illustration. As such, in some embodiments, the protective pattern CPT may be also disposed in the display area DA.

The protective pattern CPT may be disposed at (e.g., in or on) the touch sensing layer TSU. For example, as shown in FIG. 9, the protective pattern CPT may be disposed at (e.g., in or on) the sixth conductive layer CTL6 that is the same layer as that of the first sub fan-out lines FOL2_1, but the present disclosure is not limited thereto. When a touch electrode of another layer is further disposed between the first touch insulating layer SIL1 and the second touch insulating layer SIL2, the protective pattern CPT may be disposed at (e.g., in or on) the same layer as that of the touch electrode of the other layer.

The display device 1 according to the present embodiment includes the protective pattern CPT, thereby preventing or substantially preventing delamination of the insulating films disposed on the first fan-out lines FOL1.

For example, at least one of the second touch insulating layer SIL2, the first touch insulating layer SIL1, the third encapsulation layer TFE3, the first encapsulation layer TFE1, or the line passivation film FPF may be disposed between the protective pattern CPT and the first fan-out lines FOL1.

The protective pattern CPT may cover the second touch insulating layer SIL2, the first touch insulating layer SIL1, the third encapsulation layer TFE3, one end of the first encapsulation layer TFE1, and one end of the line passivation film FPF. For example, the protective pattern CPT may cover the second touch insulating layer SIL2, the first touch insulating layer SIL1, the third encapsulation layer TFE3, the other end of the first encapsulation layer TFE1 in the second direction DR2, and the one end of the line passivation film FPF in the second direction DR2.

The protective pattern CPT may cover the ends of the second touch insulating layer SIL2, the first touch insulating layer SIL1, the third encapsulation layer TFE3, the first encapsulation layer TFE1, and the line passivation film FFPF, thereby preventing or substantially preventing delamination of the ends.

In some embodiments, a total thickness of an upper layer on the sixth conductive layer CTL6 may be within about 4 μm. For example, thicknesses TH1 and TH2 of the overcoat layer OC, which is an upper layer on the protective pattern CPT and the first sub fan-out lines FOL2_1, may be within about 4 μm.

Figure 10:
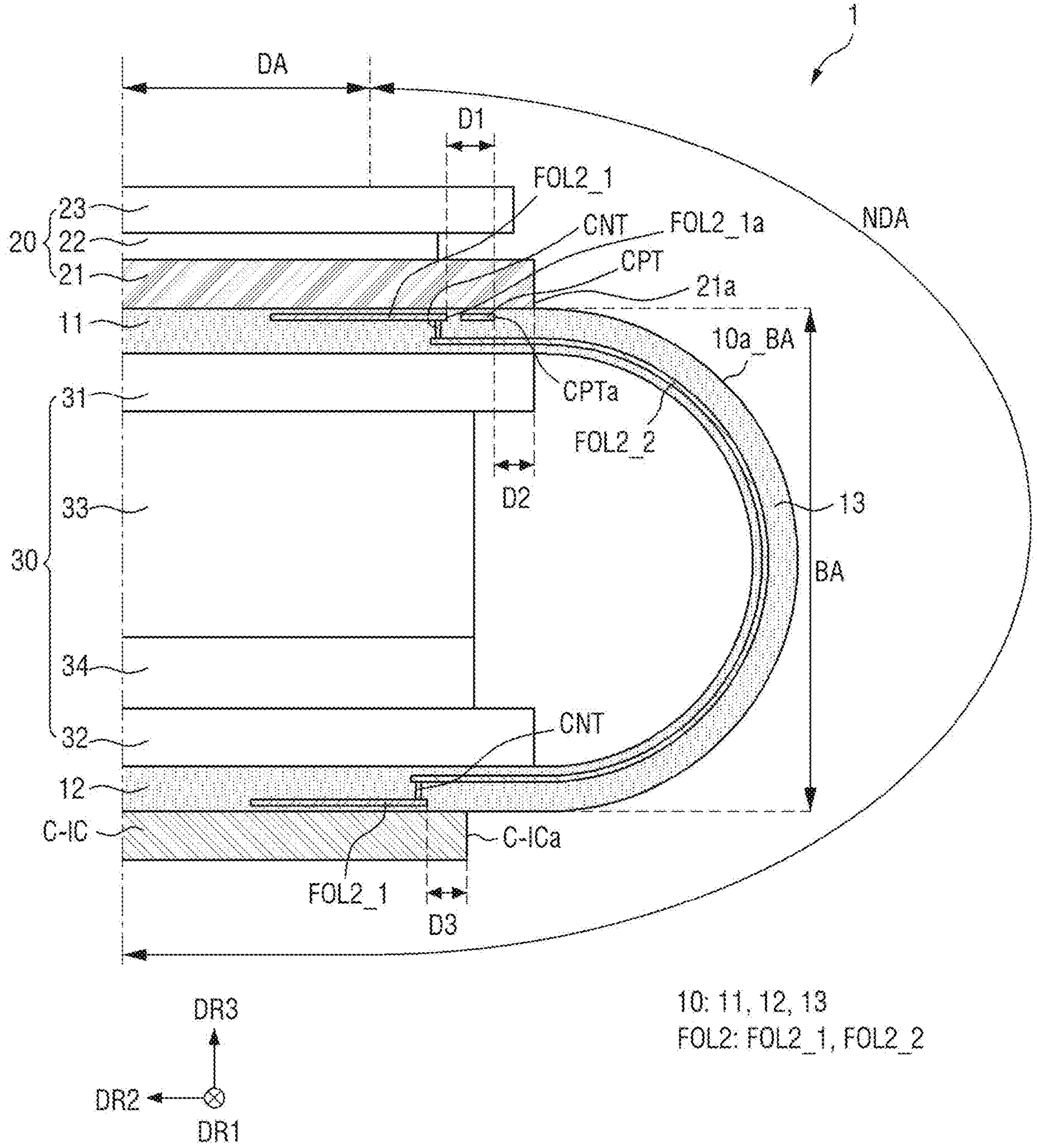
FIG. 10 is a cross-sectional view illustrating a display device according to an embodiment.

FIG. 10 is a cross-sectional view illustrating a display device according to an embodiment.

Referring to FIG. 10 along with FIGS. 7 to 9, the display panel 10 may include a first portion 11, a second portion 12, and a third portion 13.

The first portion 11 may be positioned on one side of the bending area BA. The second portion 12 may be positioned on the other side of the bending area BA. For example, the first portion 11 may be positioned in the display area DA and in the non-display area NDA between the bending area BA and the display area DA. The second portion 12 may be positioned in the non-display area NDA opposite to the display area DA with the bending area BA interposed therebetween. The first portion 11 and the second portion 12 may be flat or substantially flat portions, but the present disclosure is not limited thereto.

The third portion 13 may be positioned between the first portion 11 and the second portion 12. The third portion 13 may be positioned in the bending area BA.

The first sub fan-out line FOL2_1 may be extended in one direction from the first portion 11. The first sub fan-out line FOL2_1 may be connected to the second sub fan-out line FOL2_2 in an area of the first portion 11, which is adjacent to the third portion 13, through the contact hole CNT. The second sub fan-out line FOL2_2 may be extended to an area of the second portion 12, which is adjacent to the third portion 13, through the first portion 11 and the third portion 13. The second sub fan-out line FOL2_2 may be connected again to the first sub fan-out line FOL2_1 in the area of the second portion 12, which is adjacent to the third portion 13, through the contact hole CNT. The first sub fan-out line FOL2_1 may be extended in one direction from the second portion 12.

The protective pattern CPT may be disposed in the area of the first portion 11, which is adjacent to the third portion 13. In some embodiments, the protective pattern CPT may be also disposed in the area of the second portion 12, which is adjacent to the third portion 13.

In some embodiments, one end CPTa of the protective pattern CPT may be more adjacent to the bending area BA or the third portion 13 than one end FOL2_1*a* of the first sub fan-out line FOL2_1. For example, the one end CPTa of the protective pattern CPT may be positioned to be adjacent to the bending area BA or the third portion 13 by as much as a first distance D1 closer than the one end FOL2_1*a* of the first sub fan-out line FOL2_1. The first distance D1 may be within about 100 μm.

In the display device 1 according to the present embodiment, an upper surface 10*a*_BA of the third portion 13 may be an exposed surface. No layer may be disposed on the upper surface 10*a*_BA of the third portion 13. For example, a bending passivation layer BPL shown in FIG. 12 may not be disposed on the upper surface 10*a*_BA of the third portion 13. Therefore, a dead space of the display device 1 may be minimized or reduced. The dead space of the display device 1 will be described in more detail below with reference to FIGS. 12 and 13.

In the display device 1 according to the present embodiment, the panel upper member 21 may be disposed on the protective pattern CPT and the first sub fan-out line FOL2_1. The panel upper member 21 may cover the protective pattern CPT and the first sub fan-out line FOL2_1. The cover tape C-IC may be disposed on the protective pattern CPT and the first sub fan-out line FOL2_1. The cover tape C-IC may cover the protective pattern CPT and the first sub fan-out line FOL2_1.

One end 21*a* of the panel upper member 21 may be more protruded toward the bending area BA than the outermost end of the sixth conductive layer CTL6. The one end 21*a* of the panel upper member 21 may be more protruded toward the bending area BA than the one end CPTa of the protective pattern CPT and/or the one end FOL2_1*a* of the first sub fan-out line FOL2_1. For example, the one end 21*a* of the panel upper member 21 may be more protruded by a second distance D2 to be closer toward the bending area BA than the one end CPTa of the protective pattern CPT or the one end FOL2_1*a* of the first sub fan-out line FOL2_1.

For example, as shown in FIG. 10, the second distance D2 may be a horizontal distance between the one end CPTa of the protective pattern CPT and the one end 21*a* of the panel upper member 21, for example, in the second direction DR2.

As another example, when there is no protective pattern CPT or when the one end FOL2_1*a* of the first sub fan-out line FOL2_1 is positioned to be more adjacent to the bending area BA or the third portion 13 than the one end CPTa of the protective pattern CPT, the second distance D2 may be a horizontal distance between the one end FOL2_1*a* of the first sub fan-out line FOL2_1 and the one end 21*a* of the panel upper member 21, for example, in the second direction DR2.

One end C-ICa of the cover tape C-IC may be more protruded toward the bending area BA than the outermost end of the sixth conductive layer CTL6. The one end C-ICa of the cover tape C-IC may be more protruded toward the bending area BA than the one end CPTa of the protective pattern CPT and/or the one end FOL2_1*a* of the first sub fan-out line FOL2_1. For example, the one end C-ICa of the cover tape C-IC may be more protruded toward the bending area BA by as much as a third distance D3 closer than the one end CPTa of the protective pattern CPT or the one end FOL2_1*a* of the first sub fan-out line FOL2_1.

For example, referring to FIG. 10, when there is no protective pattern CPT or the one end FOL2_1*a* of the first sub fan-out line FOL2_1 is positioned to be more adjacent to the bending area BA or the third portion 13 than the one end CPTa of the protective pattern CPT, the third distance D3 may be a horizontal distance between the one end FOL2_1*a* of the first sub fan-out line FOL2_1 and the one end C-ICa of the cover tape C-IC, for example, in the second direction DR2. As another example, when the one end CPTa of the protective pattern CPT is positioned to be more adjacent to the bending area BA or the third portion 13 than the one end FOL2_1*a* of the first sub fan-out line FOL2_1, the third distance D3 may be a horizontal distance between the one end CPTa of the protective pattern CPT and the one end C-ICa of the cover tape C-IC, for example, in the second direction DR2.

In the display device 1 according to the present embodiment, at least one of the panel upper member 21 or the cover tape C-IC may be more protruded than the protective pattern CPT and the first sub fan-out line FOL2_1 to shield static electricity (e.g., electromagnetic waves) flowing from the outside.

For example, a total thickness of the insulating films disposed on an upper portion of the second sub fan-out line FOL2_2 disposed on the third portion 13 may be greater than a total thickness of the insulating films disposed on an upper portion of the protective pattern CPT and the first sub fan-out line FOL2_1 disposed in the first portion 11. Therefore, the static electricity flowing into the second sub fan-out line FOL2_2 may be shielded by the insulating films disposed on the upper portion of the second sub fan-out line FOL2_2 disposed on the third portion 13. In an embodiment, when the upper surface 10*a*_BA of the third portion 13 is an exposed surface without the bending passivation layer BPL (e.g., see FIG. 12), static electricity of about 12 kV or less may be shielded from the third portion 13.

Because the total thickness of the insulating films disposed on the first sub fan-out line FOL2_1 and the protective pattern CPT is relatively thin, the display device 1 according to the present embodiment may shield static electricity by allowing the one end 21*a* of the panel upper member 21 and the one end C-ICa of the cover tape C-IC to be more protruded toward the bending area BA than the one end CPTa of the protective pattern CPT and/or the one end FOL2_1*a* of the first sub fan-out line FOL2_1.

In the display device 1 according to the present embodiment, the other conductive patterns desiring an electrostatic shielding due to a thin thickness of the upper insulating film may also have the same or substantially the same structure as those described above for the first sub fan-out line FOL2_1 and the protective pattern CPT. For example, the one end 21*a* of the panel upper member 21 and the one end C-ICa of the cover tape C-IC may be more protruded toward the bending area BA than the conductive pattern in which the thickness of the upper insulating film is thin. In an embodiment, the upper insulating film may be an insulating film having a total thickness (e.g., a total thickness in case of a plurality of layers) of about 4 μm or less.

Although the cover tape C-IC and the panel upper member 21 have been separately described, they may be different from each other in that the panel upper member 21 is disposed on the first portion 11 and the cover tape C-IC is disposed on the second portion 12. In other words, both the cover tape C-IC and the panel upper member 21 may be disposed on the same surface of the display panel 10 as each other, and may be more protruded toward the bending area BA than the first sub fan-out line FOL2_1. For example, the cover tape C-IC may be included in the panel upper member 21.

In an embodiment, the second distance D2 and the third distance D3 may be about 10 μm or more. When the second distance D2 and the third distance D3 are 10 μm or more, the panel upper member 21 may shield static electricity to the same or substantially the same level as that of the insulating films disposed on the upper portion of the second sub fan-out line FOL2_2 disposed in the third portion 13. When the second distance D2 and the third distance D3 are 10 μm or more, the panel upper member 21 may shield static electricity of 12 kV or less.

Figure 11:
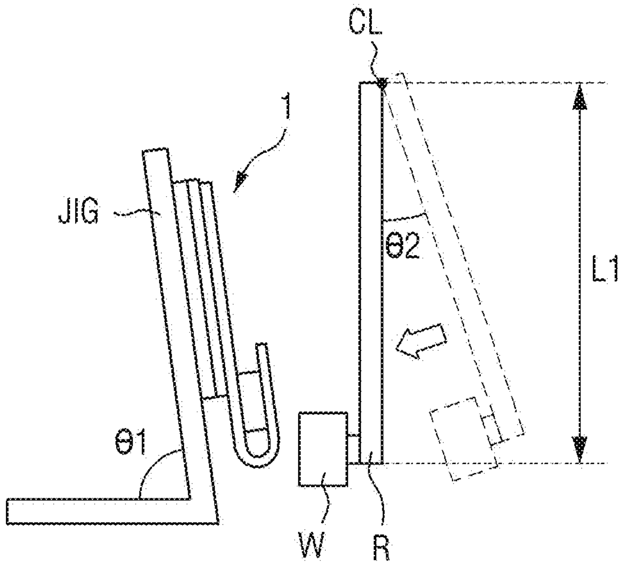
FIG. 11 is a schematic cross-sectional view illustrating a dynamic impact test of a display device according to an embodiment.

FIG. 11 is a schematic cross-sectional view illustrating a dynamic impact test of a display device according to an embodiment.

Referring to FIG. 11 along with FIG. 10, a method of performing a dynamic impact test for the third portion 13 of the display panel 10 is illustrated. The dynamic impact test according to an embodiment may be a Charpy impact test. For example, the dynamic impact test may be a Charpy impact test according to the test standard ISO 179 or ASTM D6110.

A dynamic impact test device may include a jig JIG, a rod R, and a weight W.

The jig JIG may include an inclined surface, such that an angle formed with the ground may be a first angle θ1. One end of the rod R is fixed to a rotating shaft CL, and the other end of the rod R may perform a pendular movement. The weight W having a suitable weight (e.g., a predetermined weight) may be disposed on the other end of the rod R.

In the dynamic impact test according to an embodiment, a length L1 of the rod R may be approximately 30 cm. The weight of the weight W may be approximately 202.4 g. The weight W may be a cylindrical weight having a diameter of approximately 10 mm.

The display device 1 may be disposed on an inclined surface, such that an angle formed with the ground is the first angle θ1. The display device 1 may be disposed obliquely with respect to the ground depending on the first angle θ1 of the inclined surface.

A movement angle of the rod R may be a second angle θ2. The larger the second angle θ2, which is the movement angle of the rod R, the greater the impact amount may be, which is applied to the third portion 13 of the display panel 10 when the weight W is placed.

In the dynamic impact test according to an embodiment, a maximum dynamic impact counter angle of the display device 1 according to the present configuration may be approximately 3° or more. In more detail, the second angle θ2 may be approximately 10° or more. The maximum dynamic impact counter angle may be a maximum value of the second angle θ2 that the display device 1 can endure without being damaged.

For example, when the maximum dynamic impact counter angle of the display device 1 is 3°, damage to the display device 1 may not occur even though the weight W is placed at a position where the second angle θ2 is 3° or less. As another example, when the maximum dynamic impact counter angle of the display device 1 is 10°, damage to the display device 1 may not occur even though the weight W is placed at a position where the second angle θ2 is 10° or less.

Figure 12:
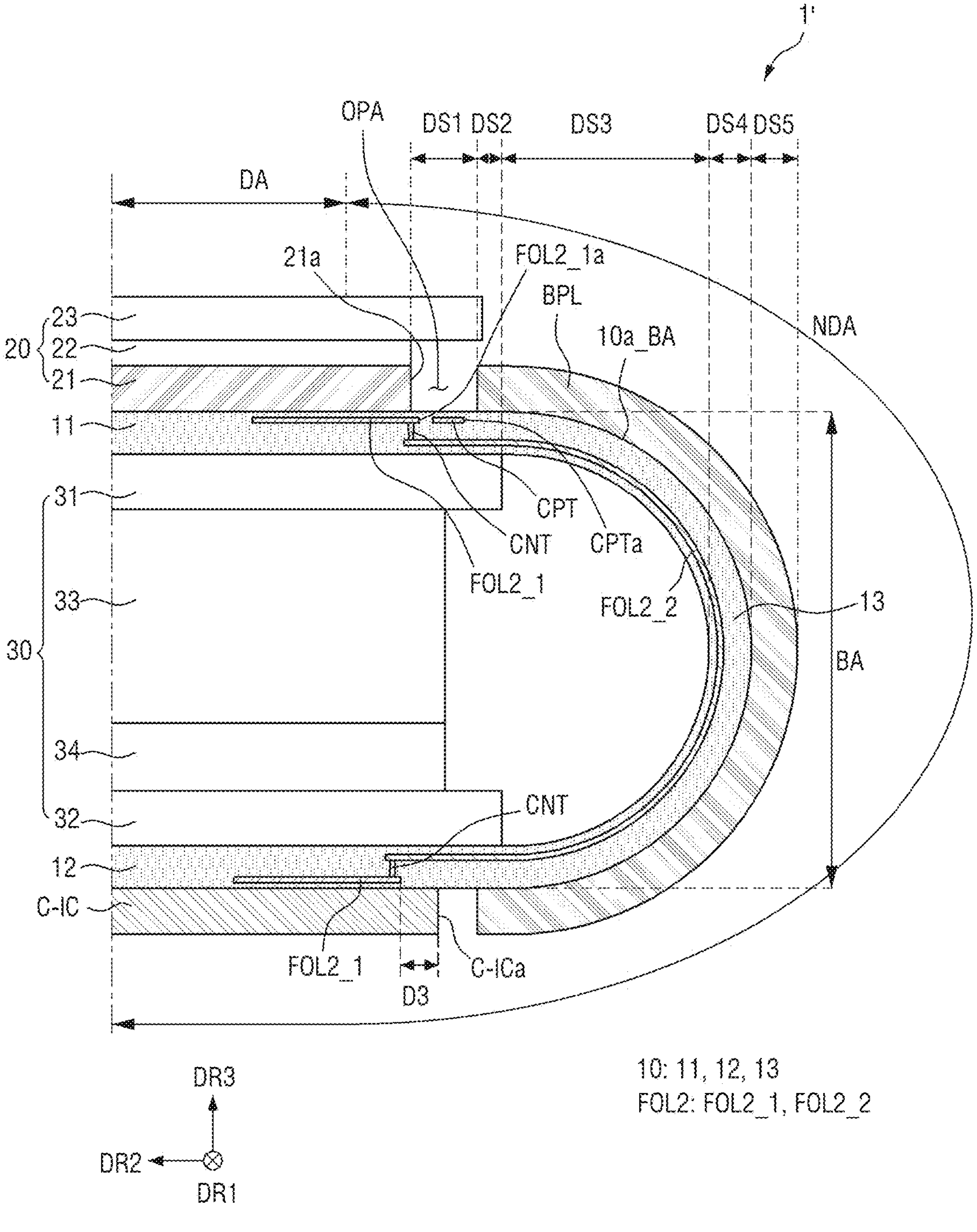
FIG. 12 is a cross-sectional view illustrating a display device according to a comparative example.

In the display device 1 according to the present embodiment, because the maximum dynamic impact counter angle is 3° or more, the display device 1 may not be deformed by a bending stress, even though the display device 1 may not include a bending passivation layer BPL (e.g., see FIG. 12).

Figure 13:
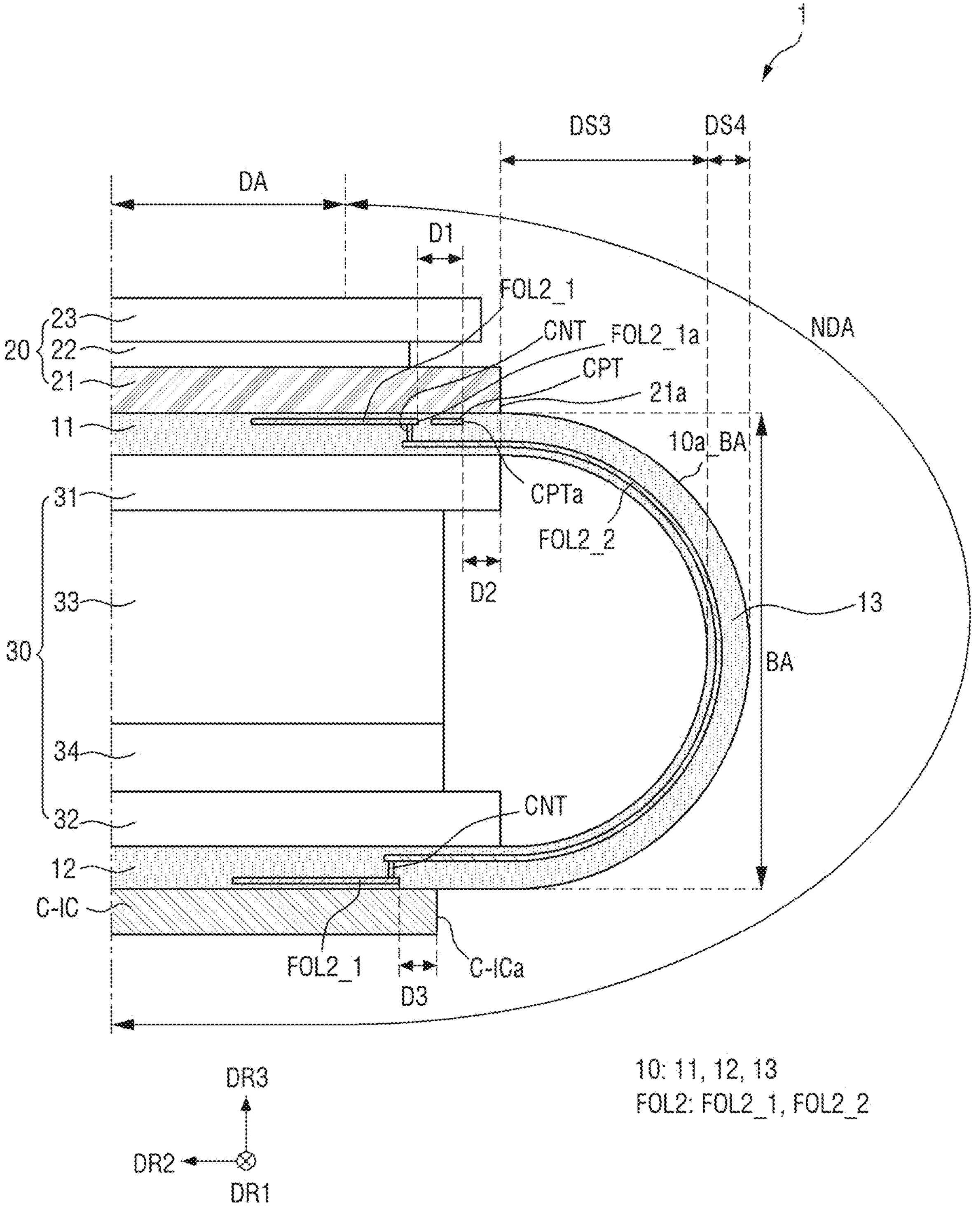
FIG. 13 is a cross-sectional view illustrating a display device according to an embodiment.

FIG. 12 is a cross-sectional view illustrating a display device according to a comparative example. FIG. 13 is a cross-sectional view illustrating a display device according to an embodiment.

Referring to FIGS. 12 and 13 along with FIG. 1, a display device 1' according to the comparative example may include a bending passivation layer BPL. The bending passivation layer BPL may mitigate a bending stress generated in the bending area BA. The bending passivation layer BPL may include an organic material. For example, the organic material may include a photosensitive organic material, such as an acrylic material.

When the display device 1' according to the comparative example is a foldable device, the display device 1 may include an open area OPA to avoid an interference between the bending passivation layer BPL and the panel upper member 21 due to a folding slip phenomenon or a bending slip phenomenon. The folding slip phenomenon or the bending slip phenomenon is a phenomenon in which an inner surface of a thick film is more protruded than an outer surface thereof due to a difference in a length between the inner surface and the outer surface when the thick film is folded or bent.

The open area OPA refers to an area in which the bending passivation layer BPL is not disposed on the display panel 10. The open area OPA may prevent or substantially prevent interference with the bending passivation layer BPL due to a slip of the panel upper member 21 when the display device 1 is folded, and may prevent or substantially prevent interference with the panel upper member 21 due to a slip of the bending passivation layer BPL when the display panel 10 is bent. The display device 1' according to the comparative example has a first dead space DS1 by as much as the open area OPA.

The display device 1' according to the comparative example may have a second dead space DS2 that overlaps with a first panel support film 31 and a second panel support film 32 to prevent or substantially prevent delamination of the bending passivation layer BPL.

The display device 1' according to the comparative example may have a third dead space DS3 that is an area for bending of the display panel 10. For example, the third dead space DS3 may correspond to a radius of curvature of the bending area BA.

The display device 1' according to the comparative example may have a fourth dead space DS4 corresponding to a thickness of the display panel 10.

The display device 1' according to the comparative example may have a fifth dead space DS5 corresponding to a thickness of the bending passivation layer BPL.

On the other hand, the display device 1 according to the present embodiment (e.g., see FIG. 13) may not include the bending passivation layer BPL.

Because the display device 1 according to the present embodiment does not include the bending passivation layer BPL, there may be no interference between the panel upper member 21 and the bending passivation layer BPL, and thus, the display device 1 according to the present embodiment may not include the first dead space DS1.

Because the display device 1 according to the present embodiment does not include the bending passivation layer BPL, there may be no delamination of the bending passivation layer BPL, and thus, the display device 1 according to the present embodiment may not include the second dead space DS2.

Because the display device 1 according to the present embodiment does not include the bending passivation layer BPL, there may be no thickness of the bending passivation layer BPL, and thus, the display device 1 according to the present embodiment may not include the fifth dead space DS5.

The display device 1 according to the present embodiment may not include the first dead space DS1, the second dead space DS2, and the fifth dead space DS5, so that the dead space may be minimized or reduced when compared to the comparative example.

Hereinafter, some other embodiments of the display device will be described in more detail. In the following embodiments, the same or substantially the same elements as those described above are denoted with the same reference numerals, and thus, redundant description thereof may not be repeated and the differences therebetween may be described in more detail hereinafter.

Figure 14:
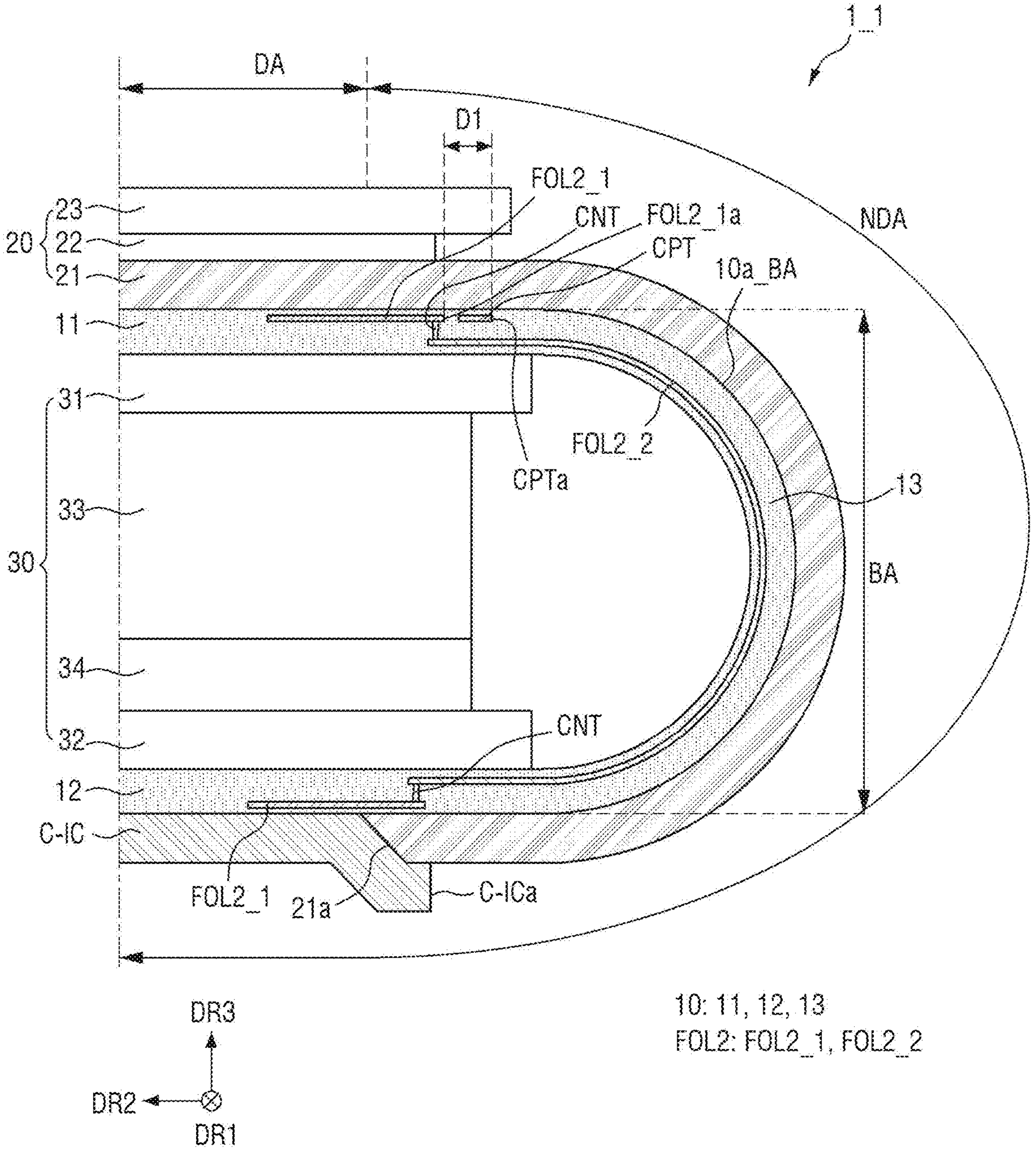
FIG. 14 is a cross-sectional view illustrating a display device according to another embodiment.

FIG. 14 is a cross-sectional view illustrating a display device according to another embodiment.

Referring to FIG. 14, a display device 1_1 according to the present embodiment may differ from the display device 1 described above with reference to FIG. 10 and the like, in that the panel upper member 21 may cover all of the first to third portions 11, 12, and 13 of the display panel 10.

In more detail, the panel upper member 21 of the display device 1_1 according to the present embodiment may be extended from the display area DA to the non-display area NDA. For example, the panel upper member 21 may be disposed on the first portion 11, the third portion 13, and the second portion 12 of the display panel 10.

The panel upper member 21 may cover the second fan-out line FOL2 positioned in the first portion 11, and the second fan-out line FOL2 positioned in the second portion 12. The panel upper member 21 may cover the second fan-out line FOL2 positioned in the third portion 13. The panel upper member 21 may shield static electricity flowing into the second fan-out line FOL2 from the outside.

One end 21*a* of the panel upper member 21 may be disposed on the second portion 12. The one end 21*a* of the panel upper member 21 may overlap with the cover tape C-IC in the third direction DR3. A step difference may be included in the one end C-ICa of the cover tape C-IC.

An adhesive force of the panel upper member 21 to the upper surface 10*a*_BA of the third portion 13 may be smaller than that of the panel upper member 21 to the upper surface of the first portion 11. An adhesive force of an adhesive layer of the panel upper member 21 may be removed or weakened at a portion that is in contact with the upper surface 10*a*_BA of the third portion 13. Therefore, a delamination of the panel upper member 21 due to a bending slip may be avoided at the portion that is in contact with the upper surface 10*a*_BA of the third portion 13.

Figure 15:
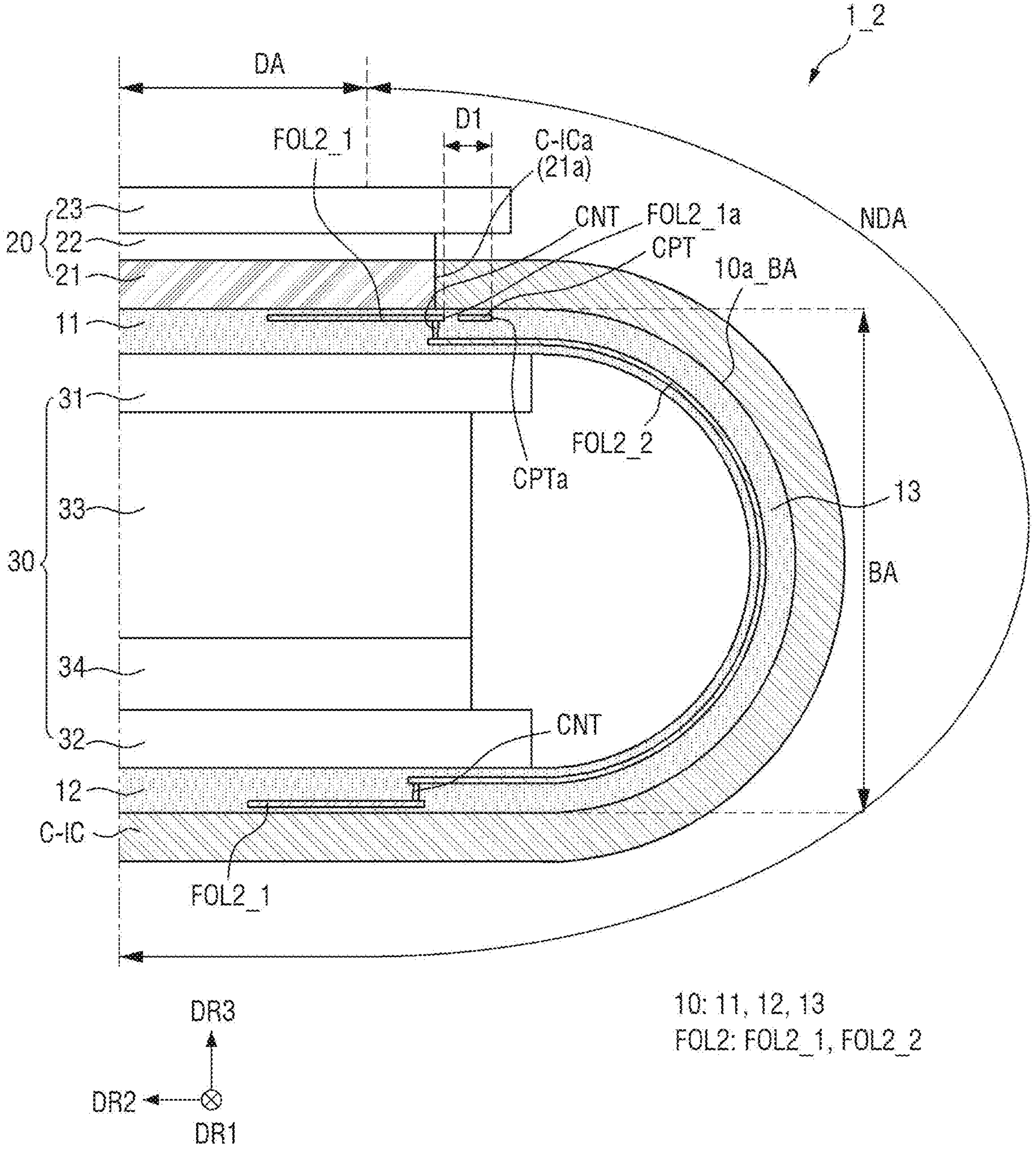
FIG. 15 is a cross-sectional view illustrating a display device according to another embodiment.

FIG. 15 is a cross-sectional view illustrating a display device according to another embodiment.

Referring to FIG. 15, a display device 1_2 according to the present embodiment may differ from the display device 1 described above with reference to FIG. 10 and the like, in that the cover tape C-IC may cover all of the first to third portions 11, 12, and 13 of the display panel 10.

In more detail, the cover tape C-IC of the display device 1_2 according to the present embodiment may be extended from the non-display area NDA that includes the bending area BA. For example, the cover tape C-IC may be disposed on the second portion 12, the third portion 13, and the first portion 11 of the display panel 10.

The cover tape C-IC may cover the second fan-out line FOL2 positioned in the second portion 12, and the second fan-out line FOL2 positioned in the first portion 11. The cover tape C-IC may cover the second fan-out line FOL2 positioned in the third portion 13. The cover tape C-IC may shield static electricity flowing into the second fan-out line FOL2 from the outside.

One end C-ICa of the cover tape C-IC may be disposed on the first portion 11. The one end C-ICa of the cover tape C-IC may be in contact with one end 21*a* of the panel upper member 21.

An adhesive force of an adhesive layer of the cover tape C-IC may be removed at a portion that is in contact with the upper surface 10*a*_BA of the third portion 13. Therefore, a delamination of the cover tape C-IC due to a bending slip may be avoided at the portion that is in contact with the upper surface 10*a*_BA of the third portion 13.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:

a display panel comprising a display area, and a bending area at one side of the display area; and a panel upper member on the display panel, wherein the display panel further comprises:

a substrate;

a first conductive layer on the substrate in the bending area; and a second conductive layer on the first conductive layer at one side of the bending area, wherein one end of the panel upper member facing toward the bending area is more protruded toward the bending area than one end of the second conductive layer facing toward the bending area, and wherein:

the display panel further comprises a light emitting element layer on the substrate;

the first conductive layer is on one surface of the light emitting element layer; and the second conductive layer is on another surface of the light emitting element layer.

2. The display device of claim 1, wherein an upper surface of the display panel is an exposed surface in the bending area.

3. The display device of claim 2, wherein the display panel does not include a bending passivation layer on the upper surface of the display panel in the bending area.

4. The display device of claim 1, wherein a distance in which the one end of the panel upper member protrudes toward the bending area from the one end of the second conductive layer is 10 μm (micrometers) or more.

5. The display device of claim 1, wherein the display panel further comprises:

an insulating layer between the first conductive layer and the second conductive layer; and a contact hole penetrating through the insulating layer, and connecting the first conductive layer with the second conductive layer.

6. The display device of claim 1, wherein the panel upper member comprises any one of a protective member, an optical member, or an adhesive member.

7. The display device of claim 1, wherein the panel upper member comprises an adhesive layer.

8. A display device comprising:

a display panel comprising a display area, and a bending area at one side of the display area; and a panel upper member on the display panel, wherein the display panel further comprises:

a substrate;

a first conductive layer on the substrate in the bending area; and a second conductive layer on the first conductive layer at one side of the bending area, wherein one end of the panel upper member facing toward the bending area is more protruded toward the bending area than one end of the second conductive layer facing toward the bending area, wherein the panel upper member comprises an adhesive layer, wherein the panel upper member covers the display area and the bending area, and wherein an adhesive force of the panel upper member at a portion covering the bending area is smaller than that of the panel upper member at a portion covering the display area.

9. The display device of claim 1, further comprising a touch driver located on one end of the display panel, wherein:

the display panel further comprises a first line on the second conductive layer, and a second line on the first conductive layer; and the first and second lines are electrically connected to the touch driver.

10. The display device of claim 9, wherein the one end of the panel upper member is more protruded toward the bending area than one end of the first line.

11. The display device of claim 10, wherein a distance in which the one end of the panel upper member protrudes toward the bending area from the one end of the first line is 10 μm (micrometers) or more.

12. The display device of claim 9, wherein:
the display panel further comprises a touch electrode on the second conductive layer; and
the touch electrode is electrically connected to the touch driver through the first line and the second line.

13. The display device of claim 12, wherein:
the first line is connected to the touch electrode;
the second line is connected to the touch driver; and
the first line and the second line are connected to each other through a contact hole.

14. A display device comprising:
a display panel comprising a display area, and a bending area at one side of the display area;
a panel upper member on the display panel; and
a display driver located on one end of the display panel,
wherein the display panel further comprises:
a substrate;
a first conductive layer on the substrate in the bending area; and
a second conductive layer on the first conductive layer at one side of the bending area,
wherein one end of the panel upper member facing toward the bending area is more protruded toward the bending area than one end of the second conductive layer facing toward the bending area, and
wherein:
the display panel further comprises a third line on the first conductive layer; and
the third line is electrically connected to the display driver.

15. The display device of claim 14, wherein the display panel further comprises:
an upper insulating film on the third line; and
a protective pattern covering the upper insulating film on the second conductive layer.

16. The display device of claim 15, wherein the one end of the panel upper member is more protruded toward the bending area than one end of the protective pattern.

17. The display device of claim 16, wherein a distance in which the one end of the panel upper member protrudes toward the bending area from the one end of the protective pattern is 10 μm (micrometers) or more.

18. The display device of claim 14, wherein:
the display panel further comprises a light emitting element, and a data line configured to provide a data voltage to the light emitting element; and
the third line is connected to the data line.

19. The display device of claim 1, wherein the display panel further comprises:
a folding area that overlaps with the display area; and
first and second non-folding areas located at opposite sides of the folding area, respectively.

20. The display device of claim 1, wherein a maximum dynamic impact counter angle of the display panel in the bending area is 3° (degrees) or more.

* * * * *